US008853841B2

(12) United States Patent
Takeuchi

(10) Patent No.: US 8,853,841 B2
(45) Date of Patent: Oct. 7, 2014

(54) LEAD FRAME WHICH INCLUDES TERMINAL PORTION HAVING THROUGH GROOVE COVERED BY LID PORTION, SEMICONDUCTOR PACKAGE, AND MANUFACTURING METHOD OF THE SAME

(71) Applicant: Shinko Electric Industries Co., Ltd., Nagano (JP)

(72) Inventor: Yukiharu Takeuchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/855,840

(22) Filed: Apr. 3, 2013

(65) Prior Publication Data

US 2013/0277817 A1 Oct. 24, 2013

(30) Foreign Application Priority Data

Apr. 20, 2012 (JP) ................. 2012-097053

(51) Int. Cl.
| | |
|---|---|
| H01L 23/495 | (2006.01) |
| H01L 23/544 | (2006.01) |
| H01L 23/48 | (2006.01) |
| H01L 23/52 | (2006.01) |
| H01L 29/40 | (2006.01) |
| H01L 21/48 | (2006.01) |
| H01L 23/34 | (2006.01) |
| H01L 23/00 | (2006.01) |

(52) U.S. Cl.
CPC ....... *H01L 23/34* (2013.01); *H01L 2224/73265* (2013.01); *H01L 2224/48247* (2013.01); *H01L 21/4821* (2013.01); *H01L 2224/49171* (2013.01); *H01L 24/45* (2013.01); *H01L 24/97* (2013.01); *H01L 2224/45147* (2013.01); *H01L 2224/97* (2013.01); *H01L 2224/48091* (2013.01); *H01L 2924/01047* (2013.01); *H01L 2224/45144* (2013.01); *H01L 2224/32245* (2013.01)
USPC ............ 257/676; 257/620; 257/784; 257/786

(58) Field of Classification Search
USPC ......... 257/676, 787, 788, 790, 784, 786, 620; 438/113, 458, 462, 123, 112, 124, 126, 438/127, 617, 612, 666
See application file for complete search history.

(56) References Cited

U.S. PATENT DOCUMENTS

| 7,355,862 B2 * | 4/2008 | Shirai et al. ................... 361/760 |
| 2011/0108965 A1 | 5/2011 | Hess et al. | |

FOREIGN PATENT DOCUMENTS

JP 2011258870 * 12/2011

* cited by examiner

*Primary Examiner* — Matthew Reames
*Assistant Examiner* — Dilinh Nguyen
(74) *Attorney, Agent, or Firm* — IPUSA, PLLC

(57) ABSTRACT

A semiconductor package includes a lead frame including a chip mounting portion and a terminal portion, a semiconductor chip, which is mounted on the chip mounting portion and connected to the terminal portion, a through groove penetrating the terminal portion from one surface on a side of the semiconductor chip to another surface in a thickness direction of the terminal portion, a lid portion covering an end portion of the through groove on the side of the semiconductor chip, and a resin portion sealing the semiconductor chip, wherein the another surface of the terminal portion and a side surface of the terminal portion facing an outside of the semiconductor package are coated by a plating film.

10 Claims, 18 Drawing Sheets

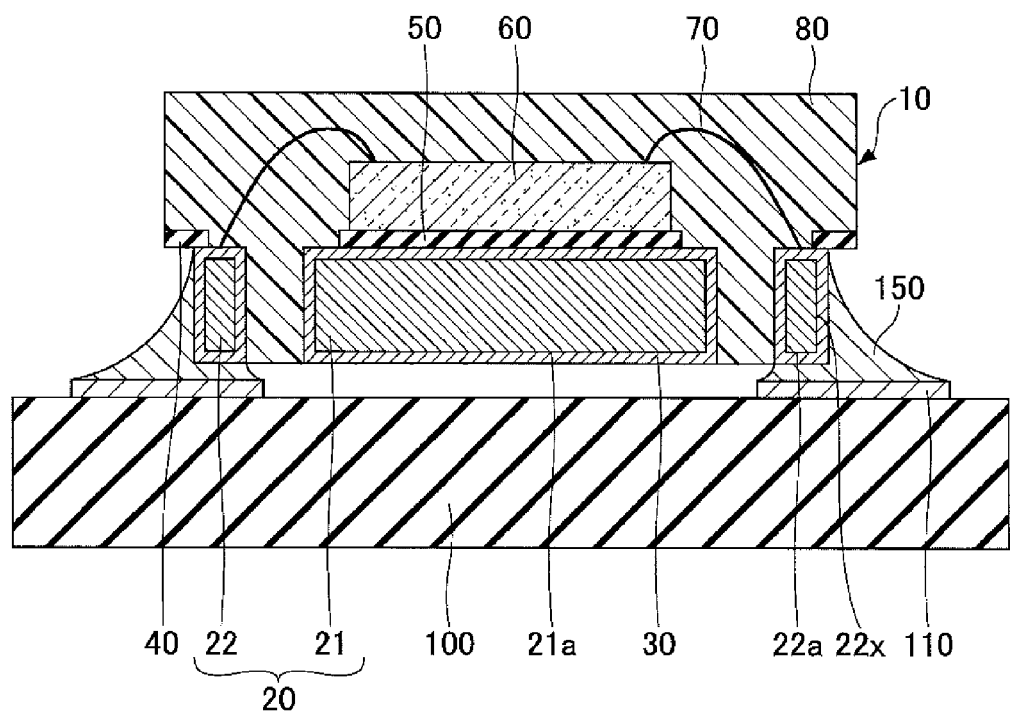

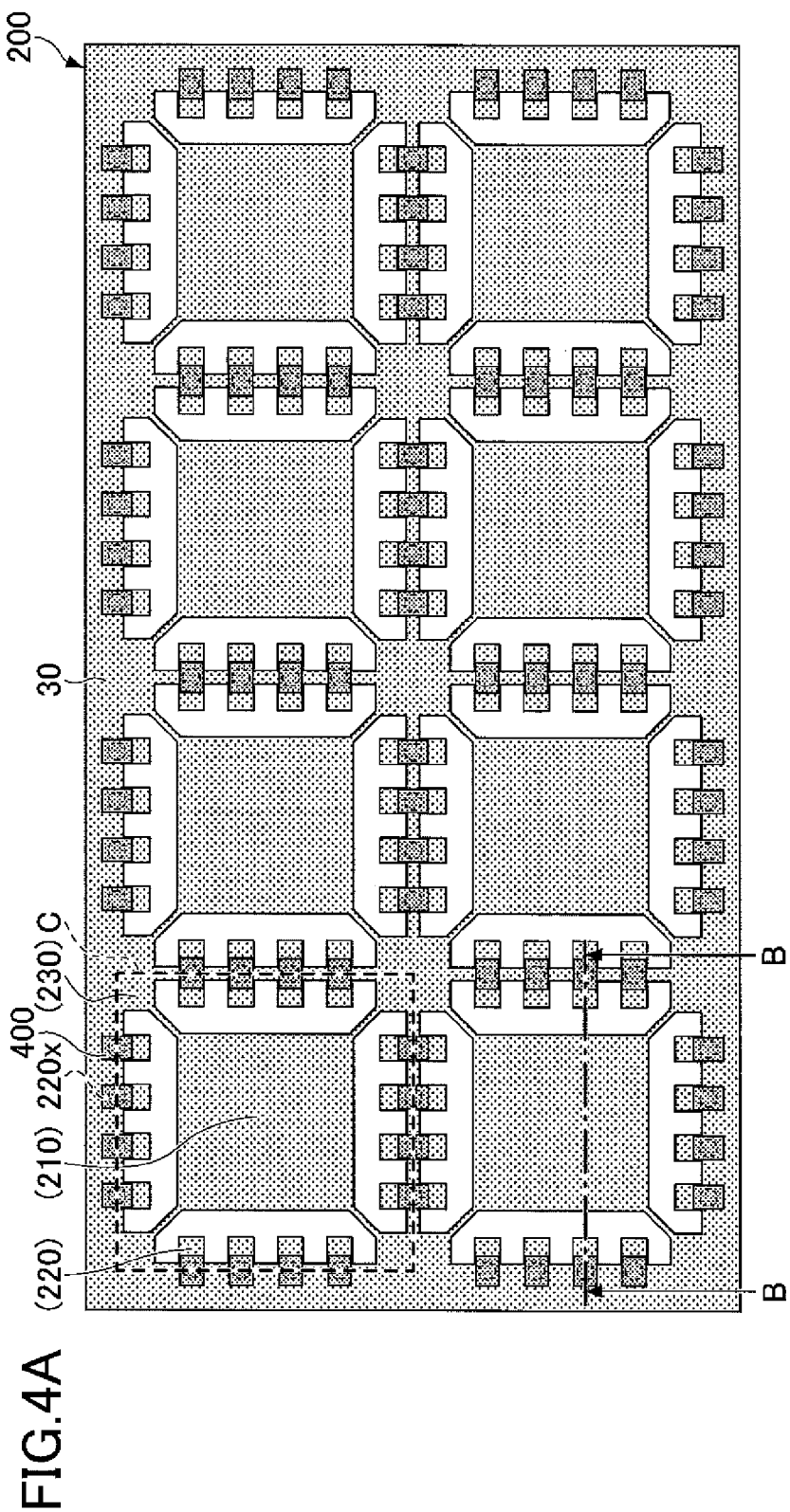
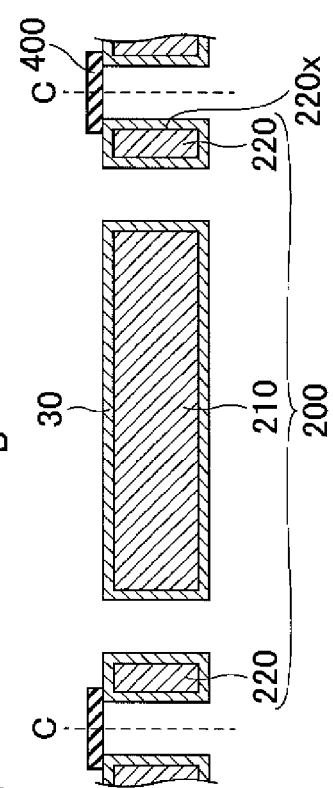
FIG. 4A
FIG. 4B

US 8,853,841 B2

LEAD FRAME WHICH INCLUDES TERMINAL PORTION HAVING THROUGH GROOVE COVERED BY LID PORTION, SEMICONDUCTOR PACKAGE, AND MANUFACTURING METHOD OF THE SAME

CROSS-REFERENCE TO RELATED APPLICATIONS

This application is based upon and claims the benefit of priority of the prior Japanese Patent Application No. 2012-097053, filed on Apr. 20, 2012, the entire contents of which are incorporated herein by reference.

FIELD

The embodiments discussed herein are related to a lead frame, a semiconductor package, and a manufacturing method of the same.

BACKGROUND

For example, in a leadless semiconductor package such as a Small-Outline No Lead (SON) or Quad Flat No Lead (QFN), external connection terminals for connecting to a substrate or the like are exposed on a bottom surface or side surfaces that appear while cutting and dicing a wafer into semiconductor packages. Ordinarily, a plating film is formed before dicing the wafer into the semiconductor packages. Therefore, the plating film is formed on the bottom surface of the external connection terminal exposed on the semiconductor package. However, the plating film is not formed on the side surfaces of the external connection terminals exposed on the semiconductor package.

Therefore, when the semiconductor package is mounted on the substrate or the like using solder, the side surfaces of the external connection terminals scarcely contribute to wet of the solder or connection, but the bottom surfaces of the external connection terminals mainly contribute to the wet of the solder or the connection. As a result, the amount of the solder formed between the semiconductor package and the substrate becomes small. Therefore, stress generated by a difference between thermal expansion coefficient of the semiconductor package and the thermal expansion coefficient of the substrate may cause connection reliability between the semiconductor package to be degraded.

As a measure of improving the connection reliability, a through hole may be formed in the external connection terminal. For example, a solder material or a conductive material such as gold or silver fills the inside of the through hole to prevent a resin from intruding inside the through hole at a time of sealing with the resin. In this example, after dicing into the semiconductor packages, the conductive material filling the inside of the through hole is exposed on the side surfaces of the semiconductor package as a part of the external connection terminals to thereby try to improve the connection reliability as disclosed in the United States Laid-open Patent Publication No. 2011-0108965.

SUMMARY

According to an aspect of the embodiment, a semiconductor package includes a lead frame including a chip mounting portion and a terminal portion, a semiconductor chip, which is mounted on the chip mounting portion and connected to the terminal portion, a through groove penetrating the terminal portion from one surface on a side of the semiconductor chip to another surface in a thickness direction of the terminal portion, and a lid portion covering an end portion of the through groove on the side of the semiconductor chip, and a resin portion sealing the semiconductor chip, wherein the another surface of the terminal portion and a side surface of the terminal portion facing an outside of the semiconductor package are coated by a plating film.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

FIG. 2 illustrates a meniscus portion formed in a terminal portion;

FIGS. 4A and 4B are exemplary views illustrating the manufacturing process of the semiconductor package of the first embodiment.

DESCRIPTION OF EMBODIMENTS

When through holes are filled with gold or silver, there is a problem that the manufacturing cost of such a semiconductor package increases in comparison with that of a semiconductor package using an ordinary plating film because the cost of a material such as gold or silver is higher. Then, a low cost solder material is ordinarily used to fill the inside of the through hole. However, the solder material is apt to be oxidized. The surface of the semiconductor chip is easily oxidized in a mounting process of the semiconductor chip including a resin sealing process. Therefore, connection reliability in mounting the semiconductor package on the substrate cannot be sufficiently assured.

Preferred embodiments of the present invention will be explained with reference to accompanying drawings. Where the same reference symbols are attached to the same parts, repeated description of the parts is omitted.

[a] First Embodiment

[Structure of Semiconductor Package of First Embodiment]

Figure 1A:
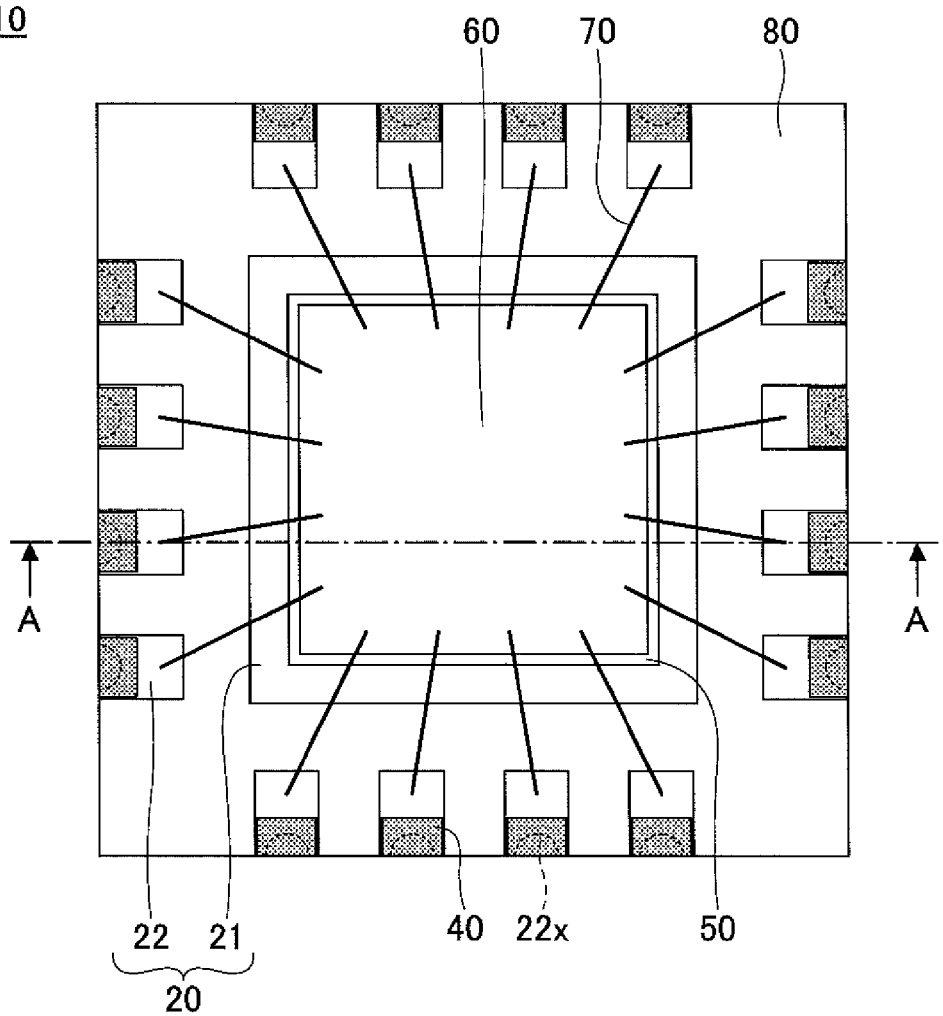
FIGS. 1A and 1B illustrate a semiconductor package of a first embodiment.
Figure 1B:
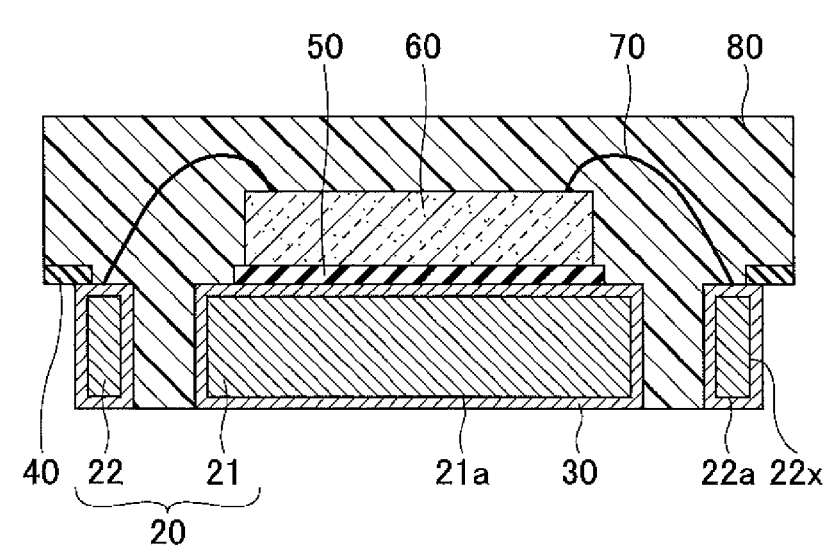

The structure of the semiconductor package of a first embodiment is described. FIG. 1 is an exemplary view of a semiconductor package of a first embodiment. FIG. 1A is a plan view. FIG. 1B is a cross-sectional view taken along a line A-A. Referring to FIG. 1, the semiconductor package 10 generally includes a lead frame 20, a plating film 30, a lid portion 40, a joining portion 50, a semiconductor chip 60, metallic wires 70 (bonding wire), and a resin portion 80. For convenience, the lid portion 40 is patterned by dots in FIG. 1A. Referring to FIG. 1A, the plating film 30 is not illustrated, and the resin portion 80 is transparent.

For example, the lead frame 20 is a conductive substrate formed by providing a thin metallic plate with a pressing process, an etching process or the like. The lead frame 20 includes a chip mounting portion 21 (a die pad) on which a semiconductor chip 60 is mounted and a terminal portion (a lead) to be an external connection terminal. The material of the lead frame 20 is, for example, copper (Cu), a copper alloy, a 42 alloy (or alloy 42, which is an alloy of Fe and Ni), or the like. The thickness of the lead frame 20 may be, for example, about 100 µm to about 250 µm.

A semiconductor chip 60 is mounted on the chip portion 21 of the lead frame 20 via the joining portion 50 while the semiconductor chip 60 faces up. The terminal portion 22 is electrically independent from the chip mounting portion 21. Another terminal portion 22 is provided and the number of the terminal portions 22 is plural. The terminal portions 22 are arranged at a predetermined pitch around the chip mounting portion 21 so as to surround the chip mounting portion. However, it is not limited to provide the terminal portions 22 around the chip mounting portion 21, For example, the terminal portions 22 may be provided on both sides of the chip mounting portion 21. The width of the terminal portion 22 is, for example, about 0.2 mm. The pitch of the terminal portions 22 is, for example, about 0.4 mm. The terminal portions 22 are electrically connected to electrode terminals (not illustrated) formed on an upper side surface of the semiconductor chip 60 via the metallic wires 70 such as a gold wire or a copper wire.

The plating film 30 is formed on the chip mounting portion 21 and the terminal portions 22. The plating film 30 is, for example, an Au film, an Ag film, a Ni/Au film (a metallic film obtained by laminating the Ni film and the Au film in this order), a NI/Pd/Au film (a metallic film obtained by laminating the Ni film, the Pd film, and the Au film in this order), or the like. The thickness of the plating film 30 may be, for example, about 0.1 µm through about several µm.

On an outer peripheral edge (hereinafter, on outer side surfaces of the terminal portions 22) of the terminal portions 22 of the semiconductor package 10, through grooves 22x penetrating the terminal portions 22, each from one surface (an upper surface) of the terminal portion 22 to the other surface (a lower surface) of the terminal portion 22 in the thickness direction of the terminal portion 22 are formed. The through grooves 22x have cross-sectional shapes (hereinafter, simply referred to as a cross-sectional shape) of substantially a semicircle taken along a plane parallel to the lower surfaces 22a of the terminal portions 22. The diameter of the through groove 22x is, for example, about 1 mm. The cross-sectional shape of the through groove 22x is not limited to the above semicircle. The cross-sectional shape of the through groove 22x may be substantially a semiellipse, a rectangule, a semipolygon, or the like.

The lid portions 40 are provided on the upper surfaces of the terminal portions 22 (a surface on a side of the semiconductor chip 60) and on the sides of the outer periphery of the semiconductor package 10. The lid portions 40 are provided to cover the upper ends of the through grooves 22x. The plating films 30 are formed on inner side surfaces of the through grooves 22x. However, the plating film 30 is not formed on the outer side surfaces of the terminal portions 22 except for the inner side surfaces of the through grooves 22x. A metallic material forming the lead frame 20 is outward exposed.

The lid portions 40 are insulative plate-like members. The lid portions 40 are, for example, resin films or the like, whose upper surface has a bonding layer. The lid portions 40 may be provided on the upper surfaces of the terminal portions 22. As the lid portion 40, an insulative plate-like member, which is previously molded to have a predetermined shape, may be attached to the upper surface side of each of the terminal portions 22 by bonding. The lid portions 40 are provided to prevent a resin from finally intruding inside the through grooves 22x when the semiconductor chip 60 or the like is sealed by the resin portion 80 in a manufacturing process of the semiconductor package 10.

The resin for the lid portions 40 is, for example, a thermosetting resin. Specifically, the resin used for the lid portion 40 is, for example, an epoxy resin, a modified epoxy resin, a polyimide resin, a modified polyimide resin, or the like. The thickness of the lid portion 40 may be about 75 through about 100 µm. Referring to FIG. 1A, the plural terminal portions 22 are provided with corresponding through grooves 22x, and the through grooves 22x are provided with corresponding lid portions 40.

The lead frame 20, the lid portions 40, the joining portion 50, the semiconductor chip 60, and the metallic wires 70 are sealed by the resin portion 80. However, the plating film 30 coating the lower surface 21a of the chip mounting portion 21, the plating film 30 coating the lower surfaces 22a of the terminal portions 22, the plating film 30 coating the inner side surfaces of the through grooves 22x, the outer side surfaces of the terminal portions 22 except for the inner side surfaces of the through grooves 22x, areas of the lid portions 40 exposed inside the through grooves 22x, and side surfaces of the lid portions 40 on the side of the outer periphery of the semiconductor package 10 are exposed on the resin portion 80. The lower surface of the plating film 30 coating the lower surface 21a of the chip mounting portion 21, the lower surfaces of the plating film 30 coating the lower surfaces 22a of the terminal portions 22, and the lower surface of the resin portion 80 are arranged on substantially the same plane. The resin portion 80 is, for example, a so-called mold resin made of an epoxy resin and a filler contained in the epoxy resin or the like.

The lower surfaces 22a of the terminal portions 22 coated by the plating film 30 and the inner side surfaces of the through grooves 22x coated by the plating film 30 are connecting potions to be connected with a conductive material such as solder or conductive paste when the semiconductor package 10 is connected to a wiring substrate or the like. Said differently, a meniscus portion is formed on the lower surface 22a of the terminal portions 22 coated by the plating film 30 and on the inner side surfaces of the through grooves 22x. For example, as illustrated in FIG. 2, the meniscus portion 150 made of a conductive material such as solder or conductive paste is formed when the semiconductor package 10 is connected to a pad 110 of the wiring substrate 100.

[Manufacturing Method of Semiconductor Package of First Embodiment]

Next, a manufacturing method of the semiconductor package of the first embodiment is described. FIGS. 3A to 5B are exemplary views illustrating a manufacturing process of the semiconductor package of the first embodiment.

Figure 3A:
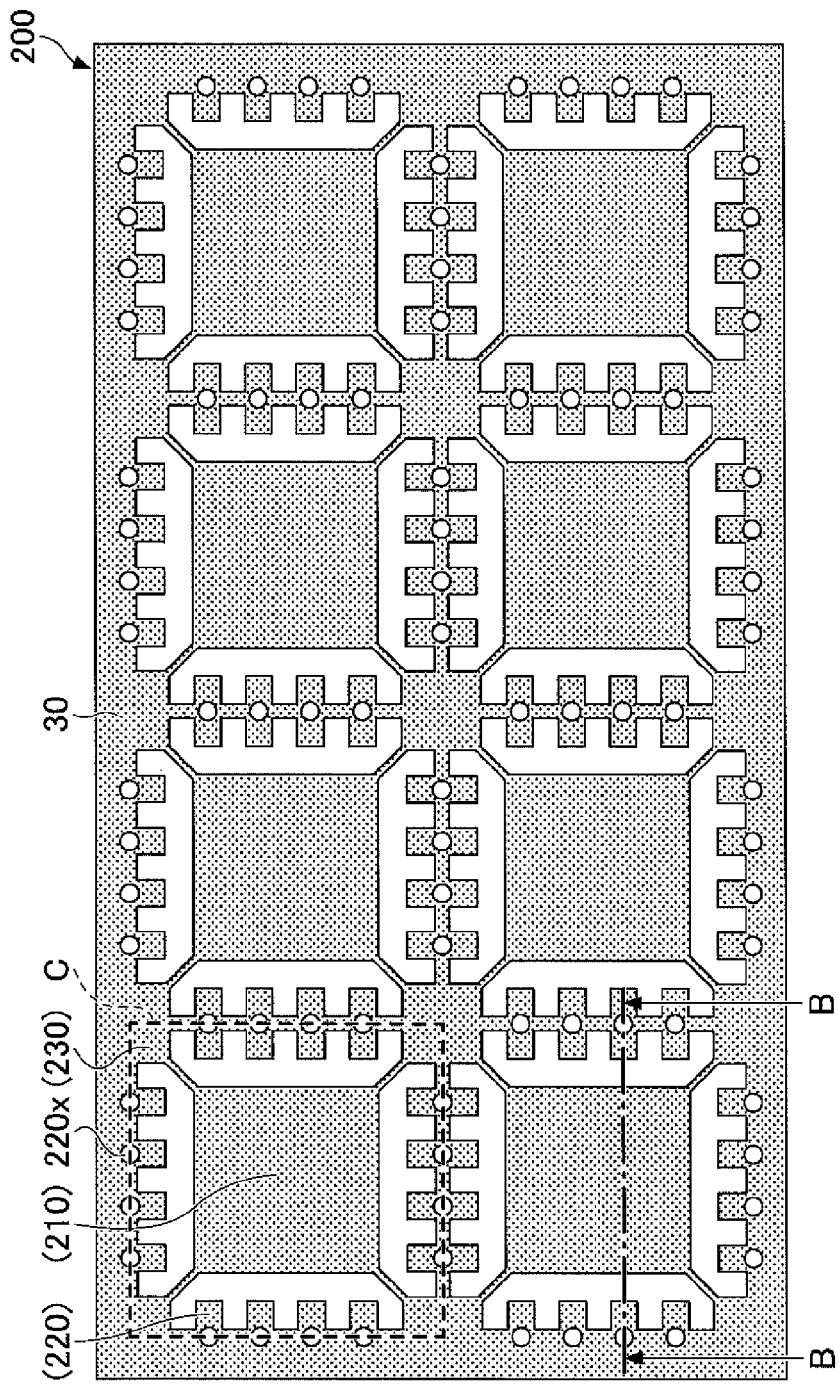
FIG. 3A and 3B are exemplary views illustrating a manufacturing process of a semiconductor package of the first embodiment.
Figure 3B:
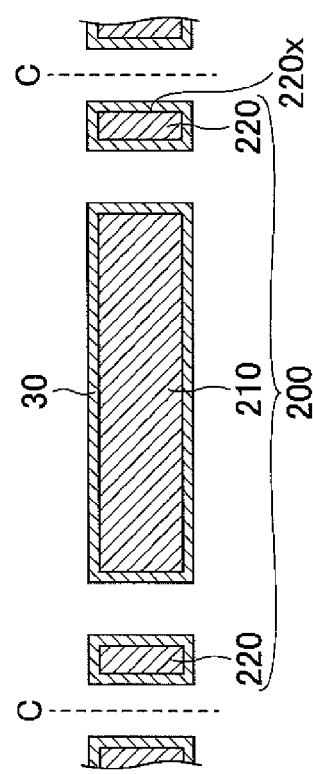

In the process illustrated in a plan view of FIG. 3A and a cross-sectional view of FIG. 3B taken along a line B-B of FIG. 3A, a lead frame 200 having a predetermined shape is formed. Thereafter, the plating film 30 is formed on the surfaces of the lead frames 200 having a predetermined shape. Referring to FIG. 3A, the plating film 30 is patterned by dots for convenience. Further, the areas 210, 220, and 230, which are coated by the plating film 30, are indicated by associating parentheses with the reference symbols of the areas 210, 220, and 230.

The lead frame 200 is formed by providing a press process, an etching process or the like to, for example, a thin metallic plate. The material of the lead frame 200 is, for example, copper (Cu), a copper alloy, a 42 alloy (or alloy 42, which is an alloy of Fe and Ni), or the like. The thickness of the lead frame 200 may be, for example, about 100 μm to about 250 μm.

The plating film 30 can be formed on a surface of the lead frame 200 by, for example, electroplating. The plating film 30 is, for example, an Au film, an Ag film, a Ni/Au film (a metallic film obtained by laminating the Ni film and the Au film in this order), a NI/Pd/Au film (a metallic film obtained by laminating the Ni film, the Pd film, and the Au film in this order), or the like. If it is preferable, a roughening process may be provided on the surface of the lead frame 200. By providing a roughening process on a surface of the lead frame 200, contact between the surface of the lead frame 200 and the plating film 30 can be improved.

The lead frame 200 includes plural areas C (hereinafter, referred to as individual package areas C) surrounded by cutting lines indicated by broken lines. The lead frame 200 is finally cut along the cutting lines indicated by the broken lines. Further, a part of the cutting line indicated by the broken line (e.g., a bridge connecting the areas to be the terminal portions 22) is removed so as to be diced into the individual package areas C. Thus, the individual package areas C become the lead frames 20.

Each of the individual package areas C include the area 210 finally to be the chip mounting portion 21, the plural areas 220 finally to be the plural terminal portions 22, and the areas 230 (supporting portions) for supporting and connecting the areas 210 and 220. The areas 220 have through holes 220x penetrating the areas 220 in the thickness direction of the areas 220. A part (substantially a half) of each of the through holes 220x finally becomes the through groove 22x. In order to form the plating film 30 after processing the lead frame 200 to have a predetermined shape, the inner side surfaces of the through holes 220x are coated by the plating film 30.

Between adjacent individual package areas C, the areas 220 are mutually connected. Each of the mutually connected areas 220 includes a single through hole 220x. A part (a substantially half) of the through hole 220x finally becomes the through groove 22x of one of the adjacent individual package areas C. The other one (substantially the remaining half) of the through hole 220x finally becomes a through groove 22x of the other one of the adjacent individual package areas C. The cross-sectional shape of the through hole 220x is substantially a circle, an ellipse, a rectangular, a polygon, or the like. The diameter of the through groove 220x is, for example, about 0.1 mm.

Next, in the process illustrated in FIGS. 4A to 4C (FIG. 4A is a plan view and FIG. 4B is a cross-sectional view taken along the line B-B of FIG. 4A), lid portions 400 are formed to cover upper end portions of the through holes 220x (a side where the semiconductor chip 60 is mounted in the latter process).

The lid portions 400 are insulative plate-like members which is to be cut so as to be the lid portions 40. For example, the lid portions 400 can be formed by attaching a resin film having a bonding layer to the entire surface of the lead frame 200, and removing a useless part. Alternatively, a resin film having a bonding layer is previously processed to have a predetermined shape and adhered on upper face sides of the through holes 220x to thereby form the lid portions 400. Alternatively, instead of the resin film, an insulating plate-like member made of a resin material and molded to have a predetermined shape may be adhered on the upper surface sides of the through holes 220x to thereby form the lid portions 400.

Figure 5A:
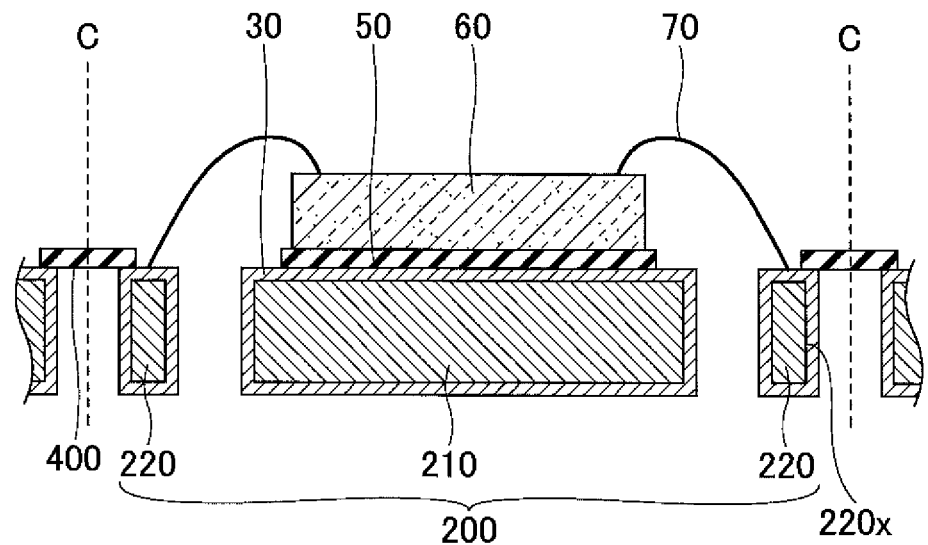
FIG. 5A and 5B are exemplary views illustrating the manufacturing process of the semiconductor package of the first embodiment.
Figure 5B:
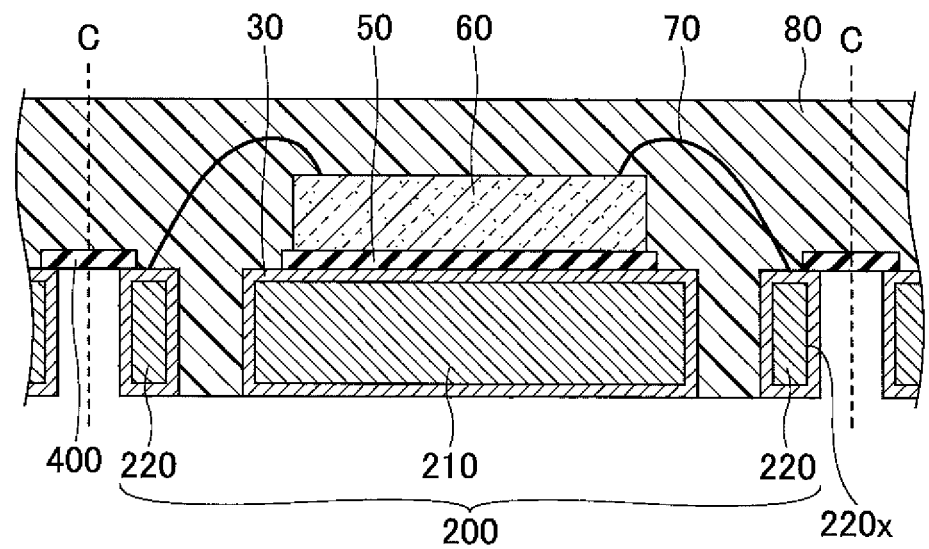

As the material used for the lid portion 400, it is preferable to select a resin, which has heat resistance in mounting the semiconductor chip 60 on the lead frame 200 including formation of the resin portion 80 in the process illustrated in FIG. 5B and excellent contact with the resin portion 80. Such a resin is, for example, an epoxy resin, a modified epoxy resin, a polyimide resin, a modified polyimide resin, or the like. The thickness of the lid portion 400 may be about 75 through about 100 μm. The width of the lid portion 400 is, for example, about 100 μm greater than the maximum outer shape of the through hole 220x.

In the process illustrated in FIG. 5A, the semiconductor chip 60 is mounted on an area 210 to be the chip mounting portion 21 of each of the individual package areas C via a joining portion 50. The joining portion 50 can be formed by attaching a die attach film to the area 210. Thereafter, the electrode terminals (not illustrated) formed on the upper surface sides of the semiconductor chip 60 are electrically connected to the areas 220 via the metallic wires 70. For example, the metallic wires 70 can be connected to electrode terminals (not illustrated) of the semiconductor chip 60 by wire bonding.

Next, in the process illustrated in FIG. 5B, the resin portion 80 is formed on the lid portions 400, the joining portion 50, the semiconductor chip 60, and the metallic wires 70. The resin portion 80 is, for example, a so-called mold resin made of an epoxy resin and a filler contained in the epoxy resin or the like. The resin portion 80 is formed by, for example, a transfer molding method, a compression molding method, or the like. It is preferable to improve contact between the lid portion 400 and the resin portion 80 by providing a roughening process on the surface of the lid portion 400 before forming the resin portion 80.

After the process illustrated in FIG. 5B, the areas 230 supporting (connecting) the areas 210 and 220 are removed to form a lead frame 20 including the chip mounting portion 21 and the plural terminal portions 22 on each of the individual package areas C. For example, the areas 230 can be removed by etching after masking portions (portions to be the chip mounting portion 21 and the plural terminal portions 22)

except for the areas 230. Alternatively, the areas 230 may be mechanically removed using a router, a mold punch, laser, or the like.

Further, by cutting the lead frame 200 along the cutting lines to thereby dice it into the individual package areas C, the plural semiconductor packages 10 (see FIG. 1A) are completed. The lead frame 200 can be cut along the cutting line (indicated by the broken lines) by, for example, a dicing saw or the like. With this, the through grooves 22x substantially in a semicircular shape in a cross-sectional view are formed from the through holes 220x. The plating films 30 are formed on inner side surfaces of the through grooves 22x. However, the plating film 30 is not formed on the outer side surfaces of the terminal portions 22 except for the inner side surfaces of the through grooves 22x. This is because the outer side surfaces of the terminal portions 22 are cut surfaces. A metallic material forming the lead frame 20 is outward exposed.

As described above, the manufacturing process at a time of shipping the semiconductor package 10 as one product is described. However, the structure (the lead frame 200 provided with the lid portion 400) illustrated in FIG. 4A may be shipped as one product. In this case, a person who obtains the structure as a product may conduct the processes in and after FIG. 5A to complete the semiconductor package 10.

As described, within the first embodiment, through grooves 22x, which penetrate the terminal portions 22 of the lead frame 20 in the thickness directions of the terminal portions 22 and whose inner side surfaces are coated by the plating film 30, are formed. With this, in a case where the semiconductor package 10 is mounted on the substrate or the like, solder is jointed (applied) not only to the plating film 30 coating the lower surfaces 22a of the terminal portions 22 but also to the plating film 30 coating the inner side surfaces of the through grooves 22x. As a result, a sufficient amount of solder can be kept in the meniscus portion to thereby improve connection reliability between the semiconductor package 10 and the substrate or the like.

For example, it is possible to provide a groove that does not penetrate the terminal portion 22 and coat the inner side surface of the groove with the plating film 30. However, because the solder amount ensuring the meniscus portion is reduced, there is the problem that sufficient connection reliability is not obtained. It is possible to avoid such the problem by providing the through groove 22x penetrating the terminal portion 22 in the thickness direction as in the first embodiment and by forming the plating film 30 coating the inner side surface of the through groove 22x.

Further, if the plating film 30 contains an expensive material such as gold (Au), the plating film is formed very thin so as to coat the inner side surfaces of the through grooves 22x. Because the plating film does not fill the through groove 22x, the manufacturing cost of the semiconductor package 10 is not greatly affected.

Further, because a metal, which is easily oxidized such as solder, is not formed on the inner side surface of the through groove 22x or the like, good soldering becomes possible in mounting the semiconductor package 10 on the substrate 100 or the like. A good meniscus portion is ensured, and the connection reliability is improved.

The upper end portions of the through holes 220x finally to be the through grooves 22x are covered by the lid portions 400. Because the resin is prevented from flowing inside the through hole 220x when the semiconductor chip 60 is sealed by the resin, the surface of the plating film 30 coating the through hole 220x can be maintained to be in a good condition. The surface of the plating film 30 coating the inner surface of the through groove 22x formed by cutting the through hole 220x can be maintained to be in a good condition. Therefore, when the semiconductor package 10 is mounted on the substrate 100 or the like, good soldering becomes possible. Said differently, a good meniscus portion is ensured and connection reliability can be improved.

Further, because the good meniscus portion is ensured on the inner side surface of the through groove 22x, a condition of soldering can be easily checked by a visual check, an inspection machine, or the like.

[b] Second Embodiment

Within the second embodiment, an exemplary semiconductor package having a structure different from that of the first embodiment is described. Within the second embodiment, explanation of constructional elements the same as those described in the above description of the first embodiment is omitted.

[Structure of Semiconductor Package of Second Embodiment]

Figure 6A:
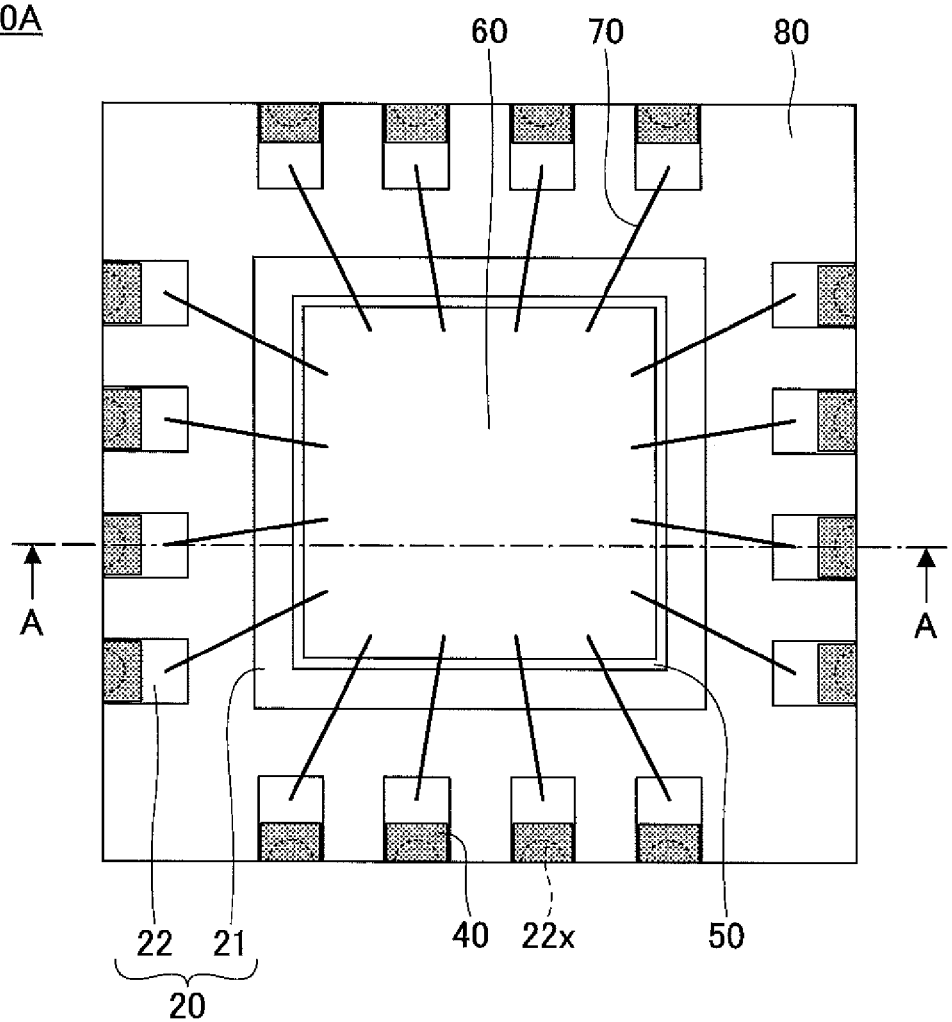
FIGS. 6A and 6B are exemplary views of a semiconductor package of a second embodiment.
Figure 6B:
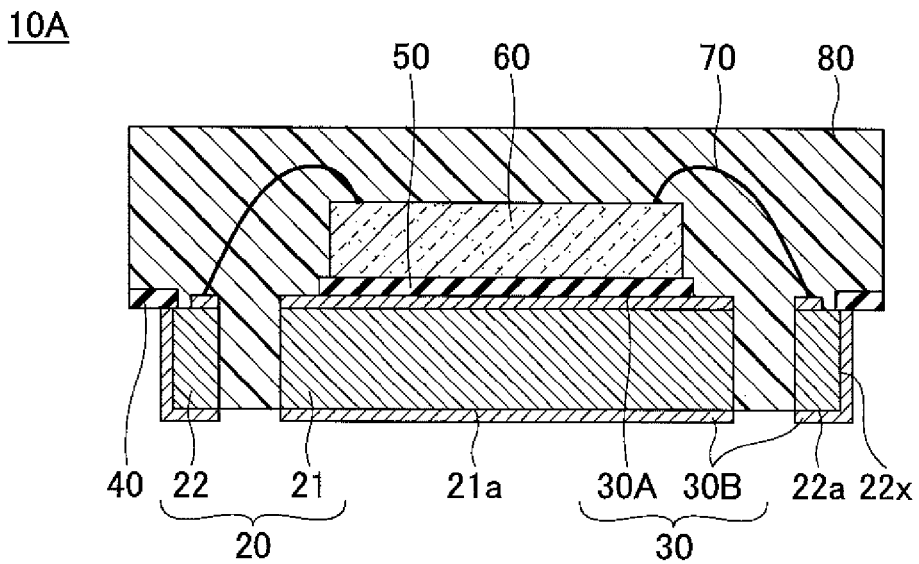

The structure of the semiconductor package of a second embodiment is described. FIGS. 6A and 6B are exemplary views of a semiconductor package 10A of the second embodiment. FIG. 6A is a plan view. FIG. 6B is a cross-sectional view taken along a line A-A. For convenience, the lid portions 40 are patterned by dots in FIG. 6A. Referring to FIG. 6A, the plating film 30 is not illustrated, and the resin portion 80 is transparent.

Referring to FIGS. 6A and 6B, the semiconductor package 10A differs from the semiconductor package 10 (see FIG. 1A) in that the plating film is formed by plating films 30A and 30B. On the upper surface of the lead frame 20, a plating film 30A is formed on an area except for neighboring areas of areas where the lid portions 40 are provided. Said differently, the lid portions 40 are provided on areas where the plating film 30A is not formed on the upper surface of the lead frame 20. However, a part of the lid portion 40 may be formed on the plating film 30A.

The plating film 30B is formed on the lower surface of the lead frame 20 (the lower surface 21a of the chip mounting portion 21 and the lower surfaces 22a of the terminal portions 22) and inner side surfaces of the through grooves 22x. In the lead frame 20, the plating film 30 is not formed on the side surfaces of the terminal portions 22 except for the side surfaces of the chip mounting portion 21 and the inner side surfaces of the through grooves 22x. The plating film 30A may partly overlap the plating film 30B. The lower surface of the lead frame 20 (the lower surface 21a of the chip mounting portion 21 and the lower surfaces 22a of the terminal portions 22) and the lower surface of the resin portion 80 are arranged on substantially the same plane.

[Manufacturing Method of Semiconductor Package of Second Embodiment]

Next, a manufacturing method of the semiconductor package of the second embodiment is described. FIGS. 7A to 9B are exemplary views illustrating a manufacturing process of the semiconductor package of the second embodiment.

Figure 7A:
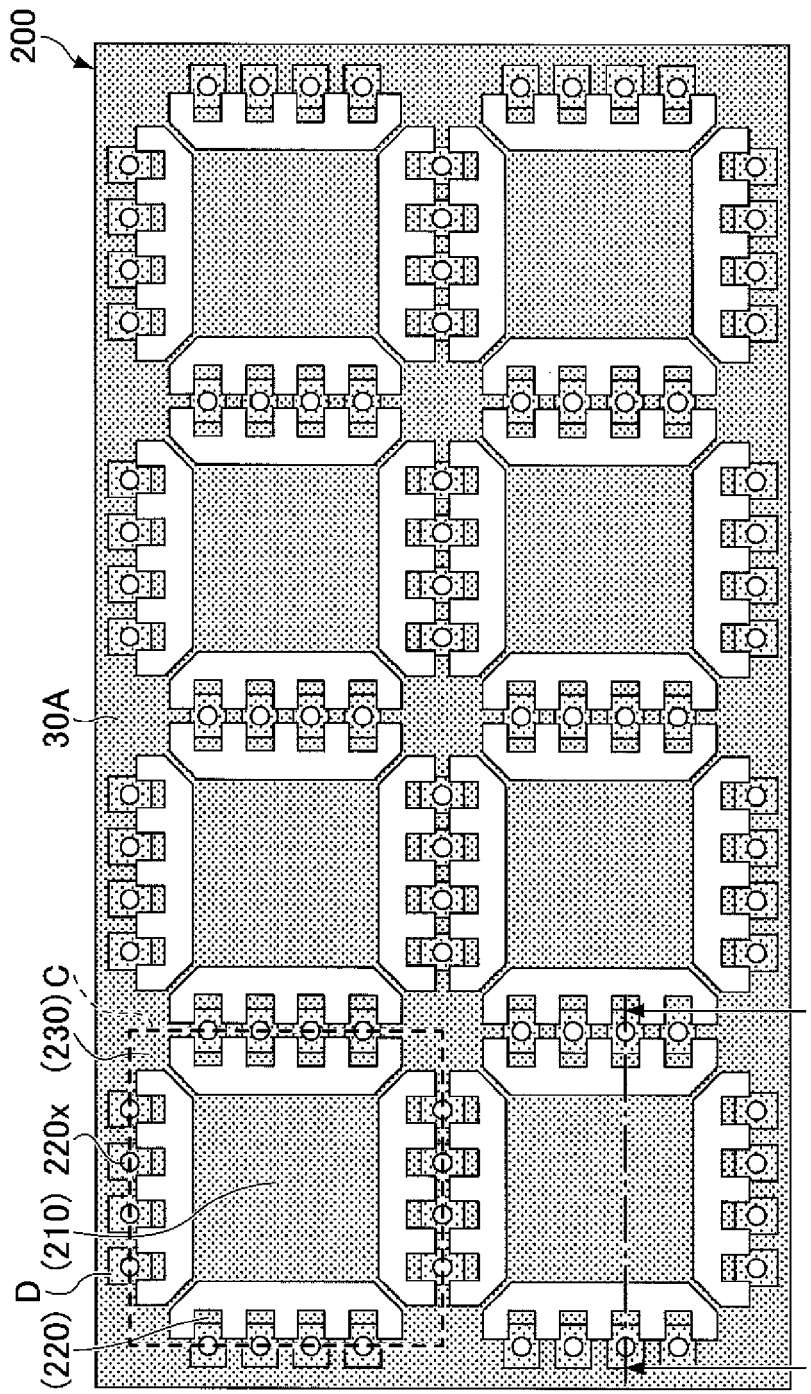
FIGS. 7A and 7B are exemplary views illustrating a manufacturing process of a semiconductor package of the second embodiment.
Figure 7B:
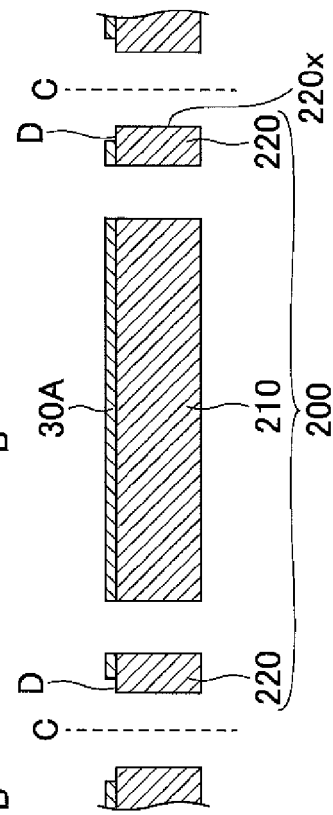

In the process illustrated in FIGS. 7A and 7B (FIG. 7A is a plan view, and FIG. 7B is a cross-sectional view taken along a line B-B), the lead frame 200 having the predetermined shape is formed in a manner similar to the process of the first embodiment illustrated in FIG. 3A. Thereafter, the plating film 30A is formed on an area except for the predetermined areas D on the upper surface of the lead frame 200. The plating film 30A is not formed by masking areas other than the upper surface of the lead frame 200.

The predetermined area D is in the vicinity of the area where the lid portion 400 is provided in the process illustrated in FIG. 8. Referring to FIG. 7A, for convenience, the plating film 30A is patterned by dots, while the area D is patterned by dots different from those for the plating film 30A. Further, the areas 210, 220, and 230, which are coated by the plating film 30A, are indicated by associating parentheses with the reference symbols of the areas 210, 220, and 230.

Figure 8A:
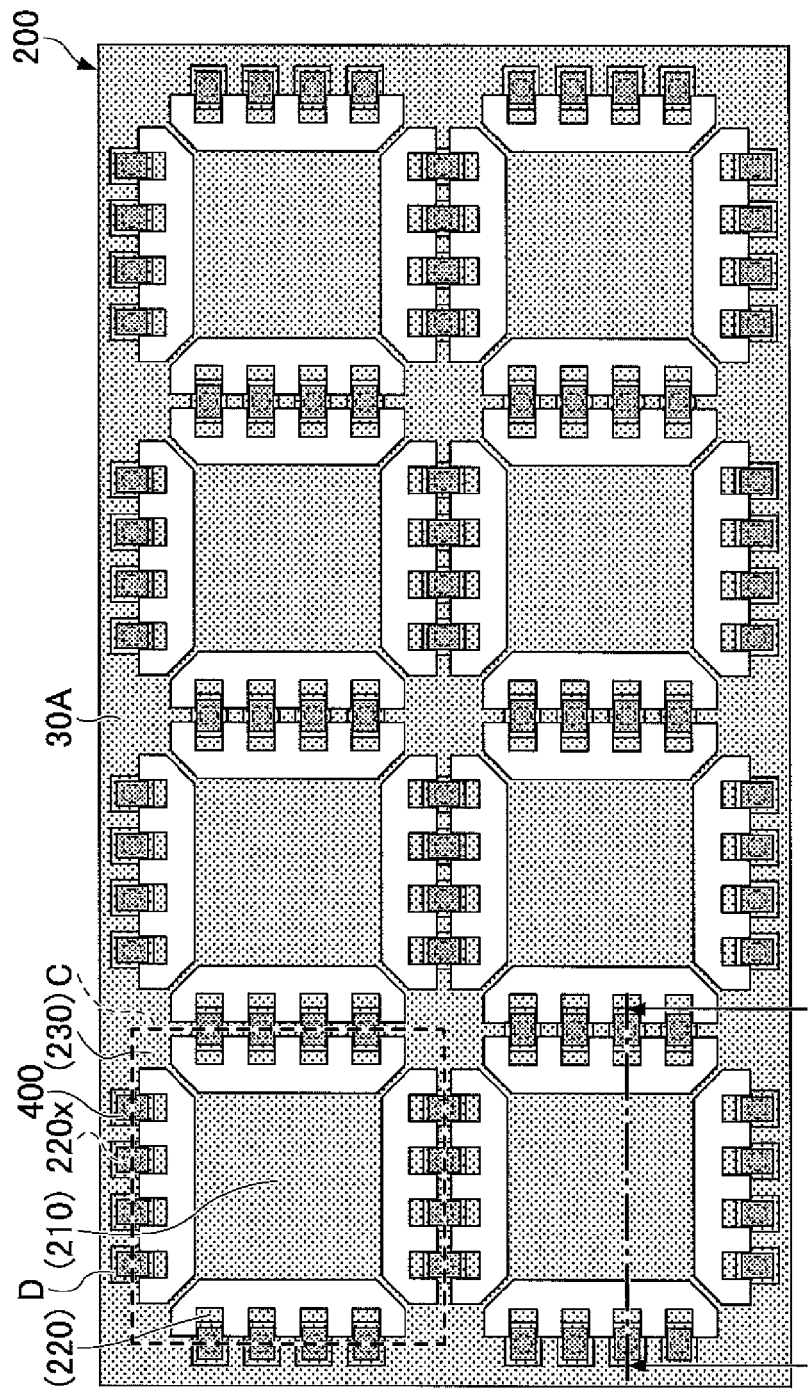
FIGS. 8A and 8B are exemplary views illustrating the exemplary manufacturing process of the semiconductor package of the second embodiment.
Figure 8B:
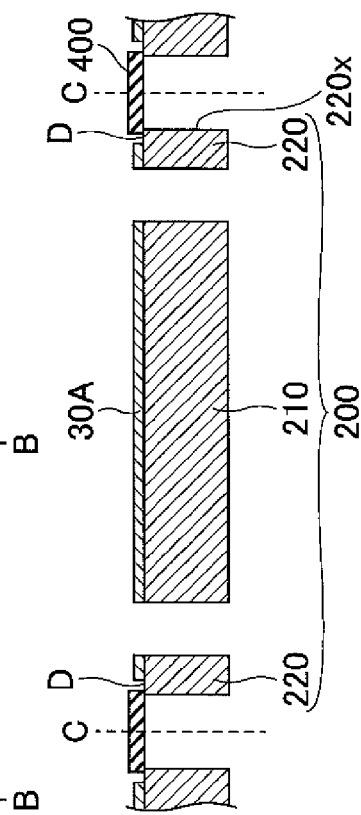

Next, in the process illustrated in FIGS. 8A and 8B (FIG. 8A is a plan view and FIG. 8B is a cross-sectional view taken along the line B-B of FIG. 8A), lid portions 400 are formed to cover upper end portions of the through holes 220x (a side where the semiconductor chip 60 is mounted in the latter process) in a manner similar to the process of the first embodiment illustrated in FIG. 4A. However, the lid portion 400 is formed on a predetermined area D, on which the plating film 30A is not formed in the process illustrated in FIG. 7A.

Figure 9A:
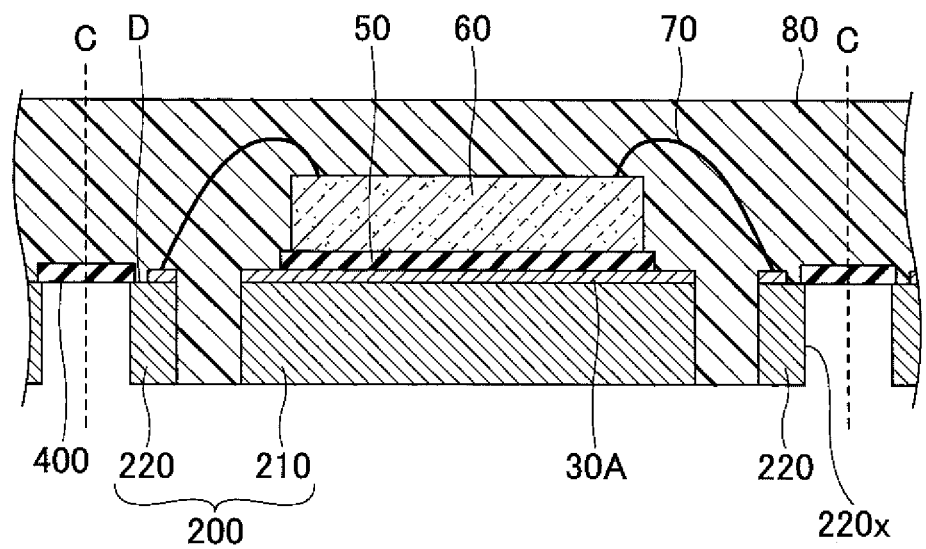
FIGS. 9A and 9B are exemplary views illustrating the manufacturing process of the semiconductor package of the second embodiment.

In the process illustrated in FIG. 9A, the semiconductor chip 60 is mounted on an area 210 to be the chip mounting portion 21 of each of the individual package areas C via the joining portion 50, in a manner similar to the process of the first embodiment illustrated in FIG. 5A. Next, in a manner similar to the process illustrated in FIG. 5B, the resin portion 80 is formed on the lead frame 200 so as to cover the lid portions 400, the joining portion 50, the semiconductor chip 60, and the metallic wires 70. In this stage, the plating film 30A is not formed on the inner side surfaces of the through holes 220x and the lower surface of the lead frame 200. The lower surface of the lead frame 200 and the lower surface of the resin portion 80 are arranged on substantially the same plane.

Figure 9B:
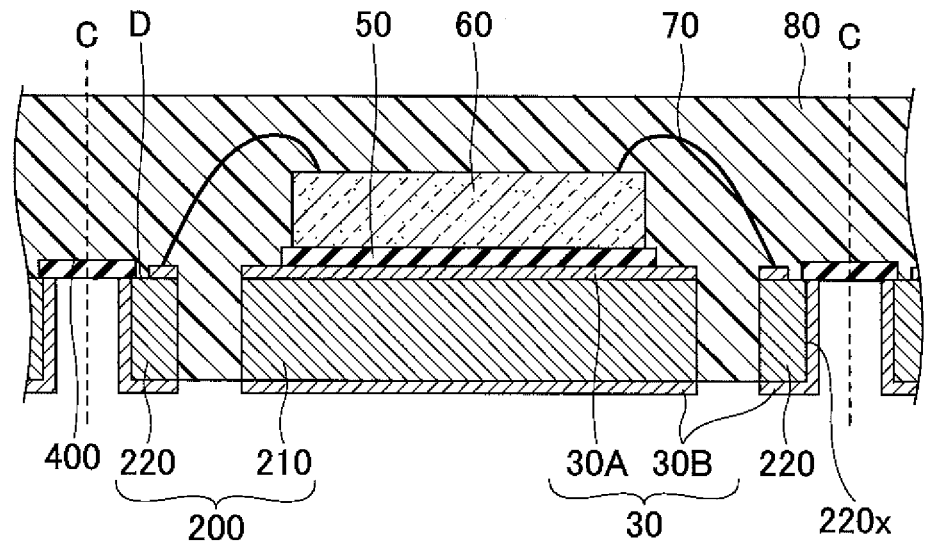

In the process illustrated in FIG. 9B, in a manner similar to the process of the first embodiment illustrated in FIG. 3A, the plating film 30B is formed on the inner side surfaces of the through holes 220x and the lower surface of the lead frame 200. In the process, because a part of the lid portion 400 contacts a plating solution, it is necessary to use a material having durability against the plating solution as a material of the lid portion 400. However, there is no problem if the above-described epoxy resin, polyimide resin, or the like is used as the lid portion 400.

After the process illustrated in FIG. 9B, the areas 230 supporting (connecting) the areas 210 and 220 are removed to form the lead frame 20 including the chip mounting portion 21 and the plural terminal portions 22 on each of the individual package areas C. Further, by cutting the lead frame 200 along the cutting lines to thereby dice it into the individual package areas C, the plural semiconductor packages 10A (see FIG. 6A) are completed. Thus, in a manner similar to the first embodiment, the through groove 22x is formed from the through hole 220x in the terminal portion 22.

As described, after providing the lid portion covering the upper end portion of each of the through holes, the plating film may be formed on the inner side surfaces of the through holes and the lower surfaces of the terminal portions. In a manner similar to the first embodiment, the structure illustrated in FIG. 8A may be shipped as a single product.

[c] Third Embodiment

Within the third embodiment, an exemplary semiconductor package having a structure different from that of the first embodiment is described. In the third embodiment, explanation of constructional elements the same as those described in the above embodiments is omitted.

[Structure of Semiconductor Package of Third Embodiment]

Figure 10A:
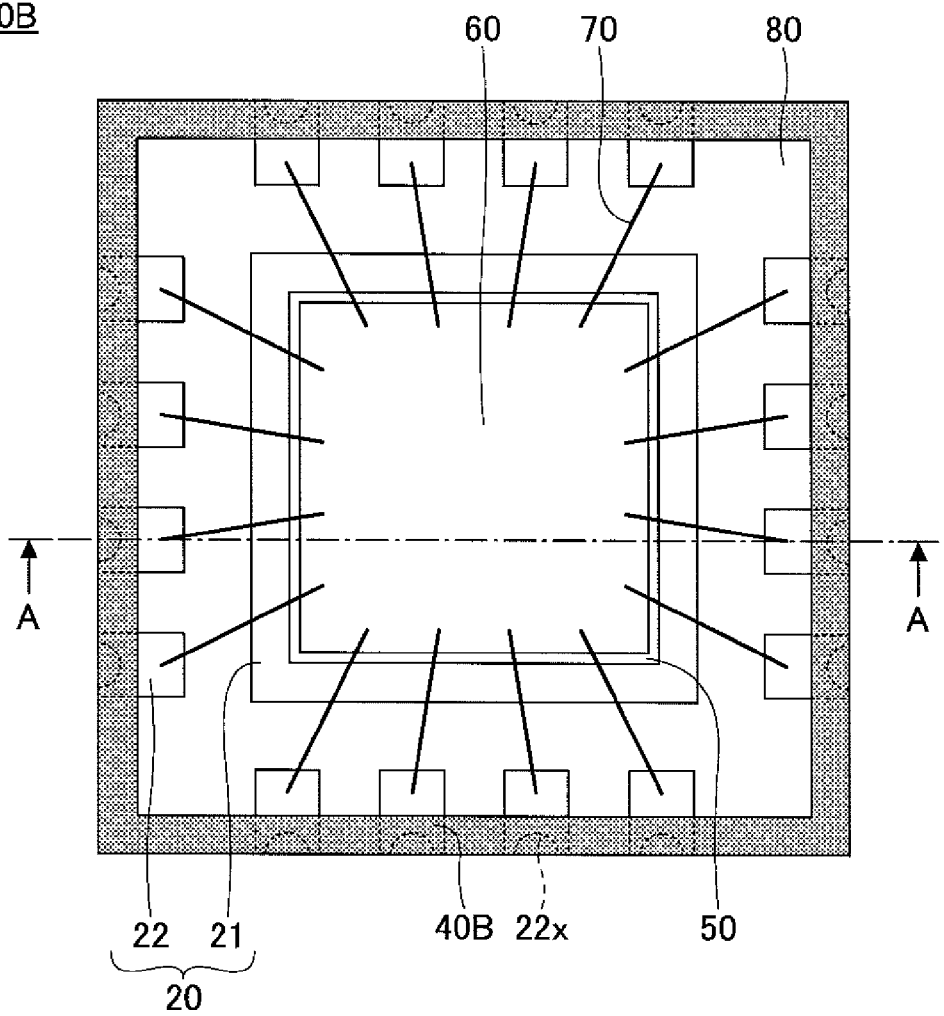
FIGS. 10A and 10B are exemplary views of a semiconductor package of a third embodiment.
Figure 10B:
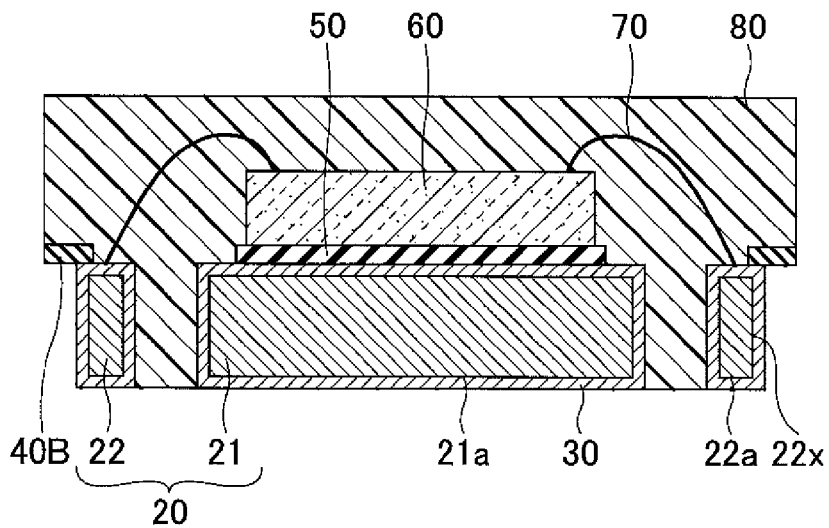

The structure of the semiconductor package of a third embodiment is described. FIGS. 10A and 10B are exemplary views of a semiconductor package of the third embodiment. FIG. 10A is a plan view. FIG. 10B is a cross-sectional view taken along a line A-A. For convenience, a lid portion 40B is patterned by dots in FIG. 10A. Referring to FIG. 10A, the plating film 30 is not illustrated, and the resin portion 80 is transparent.

Referring to FIG. 10A, the semiconductor package 10B differs from the semiconductor package 10 (see FIG. 1) at a point that the lid portions 40 are replaced by the lid portions 40B. The lid portions 40B are provided on the upper end portions of the terminal portions 22 (a surface on a side of the semiconductor chip 60) and on the side of the outer periphery of the semiconductor package 10. The lid portions 40B are provided to cover the upper ends of the through grooves 22x.

The plating films 30 are formed on inner side surfaces of the through grooves 22x. However, the plating film 30 is not formed on the outer side surfaces of the terminal portions 22 except for the inner side surfaces of the through grooves 22x. The metallic material forming the lead frame 20 is outward exposed. The structure is similar to that of the semiconductor package 10. The material, the thickness, or the like of the lid portions 40B is similar to those of the lid portions 40.

In the example of FIG. 10A, the through grooves 22x are provided in the terminal portions 22, which are arranged to surround the chip mounting portion 21. A single lid portion 40B having a frame like shape in its plan view is provided to the entirety of the through grooves 22x. However, the third embodiment is not limited thereto. It is possible to provide a single lid portion to at least two adjacent through grooves 22x. For example, four lid portions in a strip-like shape can be provided along sides of the semiconductor package 10 in a plan view of the semiconductor package 10.

[Manufacturing Method of Semiconductor Package of Third Embodiment]

Figure 11A:
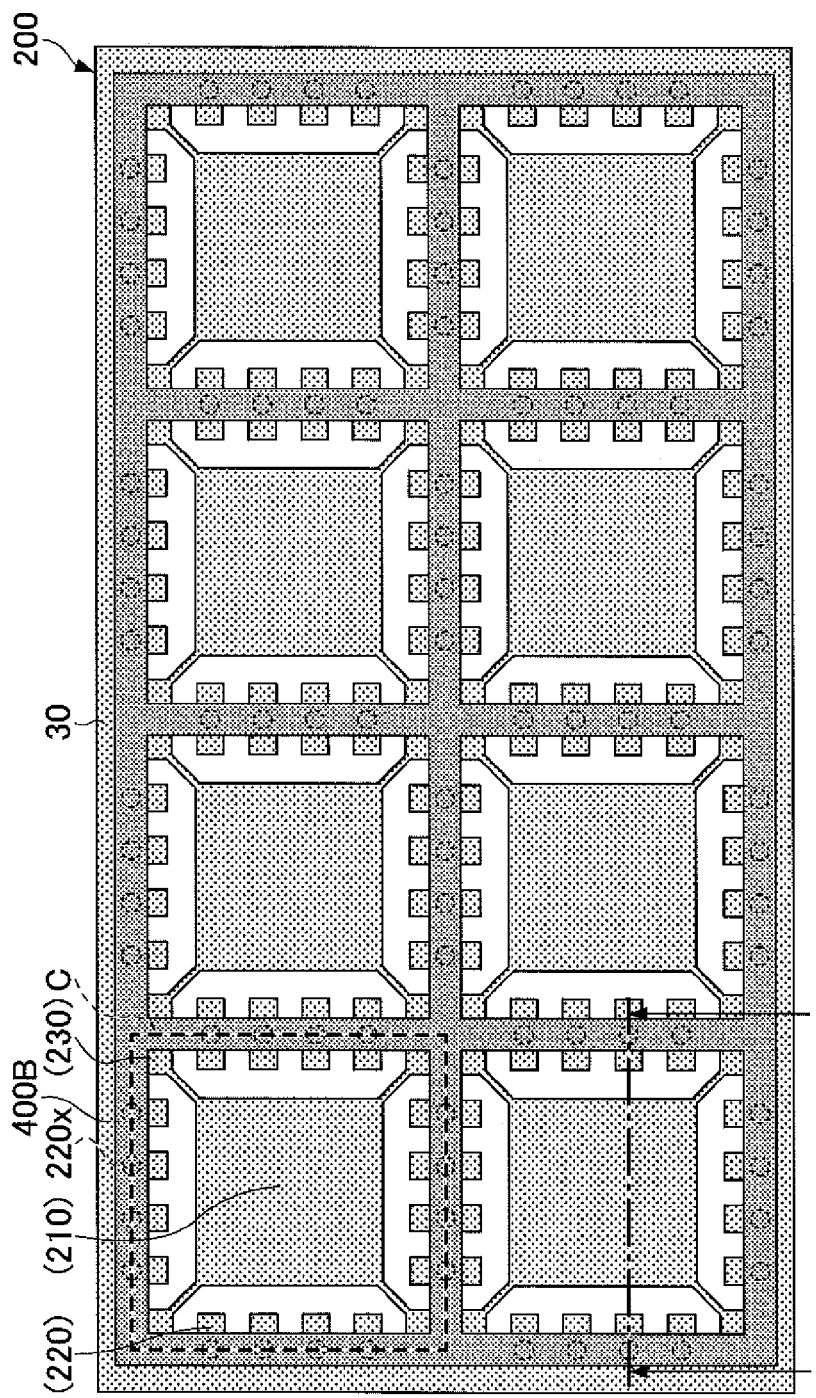
FIGS. 11A and 11B are exemplary views illustrating a manufacturing process of the semiconductor package of the third embodiment.
Figure 11B:
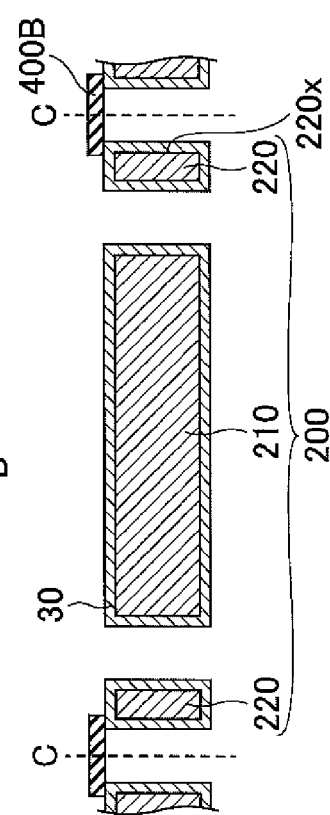

Next, a manufacturing method of the semiconductor package of a third embodiment is described. FIGS. 11A and 11B are exemplary views illustrating a manufacturing process of the semiconductor package of the third embodiment.

In order to manufacture the semiconductor package 10B, a process illustrated in FIG. 11A is performed instead of the process of the first embodiment illustrated in FIG. 4A. Said differently, a resin film having a bonding layer is adhered to the entire upper surface of the lead frame 200. Thereafter, a useless part is removed to form the lid portion 400B. Alternatively, a resin film having a bonding layer is previously processed to have a predetermined shape and is adhered on the upper face sides of the through holes 220x to thereby form the lid portion 400B. Alternatively, instead of the resin film, an insulating plate-like member made of a resin material and molded to have a predetermined shape may be adhered on the upper surface sides of the through holes 220x to thereby form the lid portions 400B. The lid portion 400B is a member finally to be the lid portion 40B.

It is possible to provide a single lid portion to at least two adjacent through grooves. For example, a single lid portion having a frame-like shape in its plan view may be provided to the entirety of the through grooves. In a manner similar to the first embodiment, the structure illustrated in FIG. 11A may be shipped as a single product.

[d] Fourth Embodiment

Within the fourth embodiment, an exemplary semiconductor package having a structure different from that of the first embodiment is described. Within the fourth embodiment, explanation of the same constructional elements as those described in the above embodiments is omitted.

[Structure of Semiconductor Package of Fourth Embodiment]

Figure 12A:
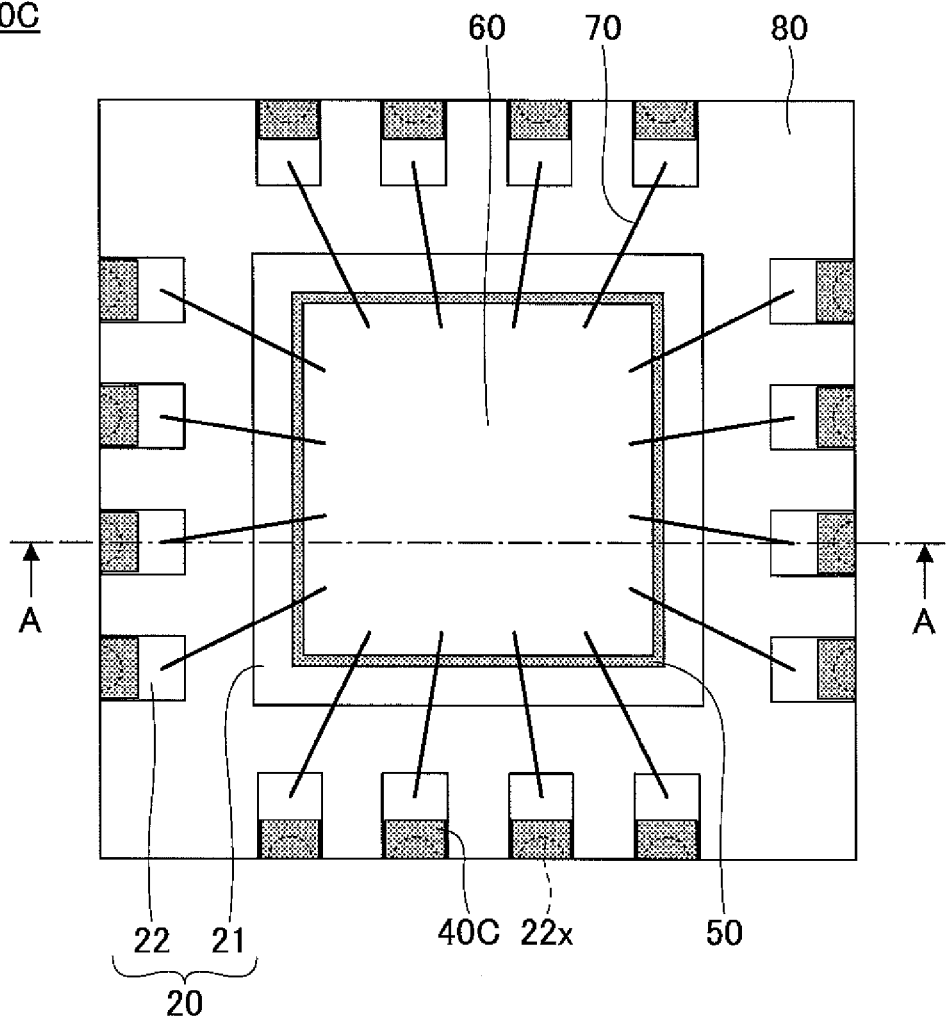
FIGS. 12A and 12B are exemplary views of the semiconductor package of a fourth embodiment.
Figure 12B:
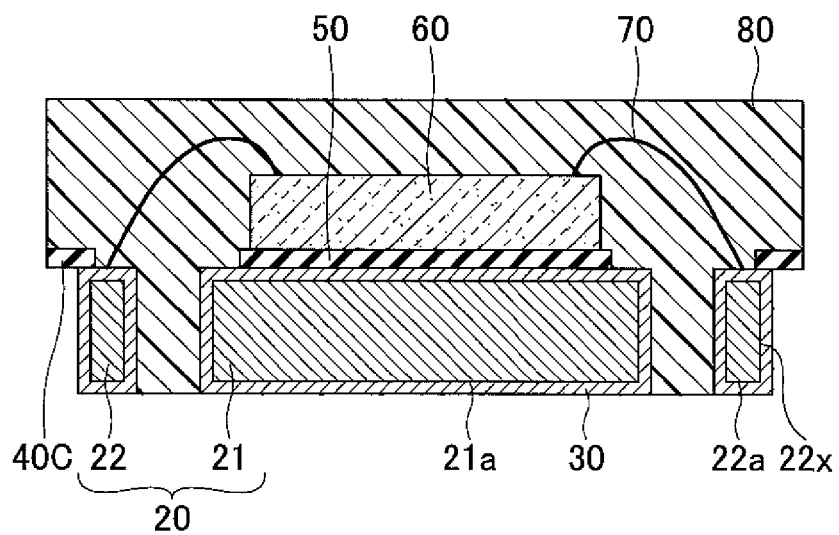

The structure of the semiconductor package of a fourth embodiment is described. FIG. 12 is an exemplary view of a semiconductor package of the fourth embodiment. FIG. 12A is a plan view. FIG. 12B is a cross-sectional view taken along a line A-A. For convenience, lid portions 40C are patterned by dots in FIG. 12A. Referring to FIG. 12A, the plating film 30 is not illustrated, and the resin portion 80 is transparent.

Referring to FIGS. 12A and 12B, the semiconductor package 10C differs from the semiconductor package 10 (see FIG. 1A) at a point that the lid portions 40 are replaced by the lid portions 40C. The lid portions 40C are provided on the through grooves 22x, respectively, on the side of the outer periphery of the semiconductor package 100 and on the upper surfaces of the terminal portions 22 (on the side of the semiconductor chip 60). The lid portions 40C cover the upper end portions of the through grooves 22x The plating films 30 are formed on inner side surfaces of the through grooves 22x. However, the plating film 30 is not formed on the outer side surfaces of the terminal portions 22 except for the inner side surfaces of the through grooves 22x. The metallic material forming the lead frame 20 is outward exposed. The structure is similar to that of the semiconductor package 10. The material of the lid portions 40C is the same as the material of the joining portion 50. The thicknesses of the lid portions 40C are the same as the thickness of the joining portion 50.

[Manufacturing Method of Semiconductor Package of Fourth Embodiment]

Figure 13A:
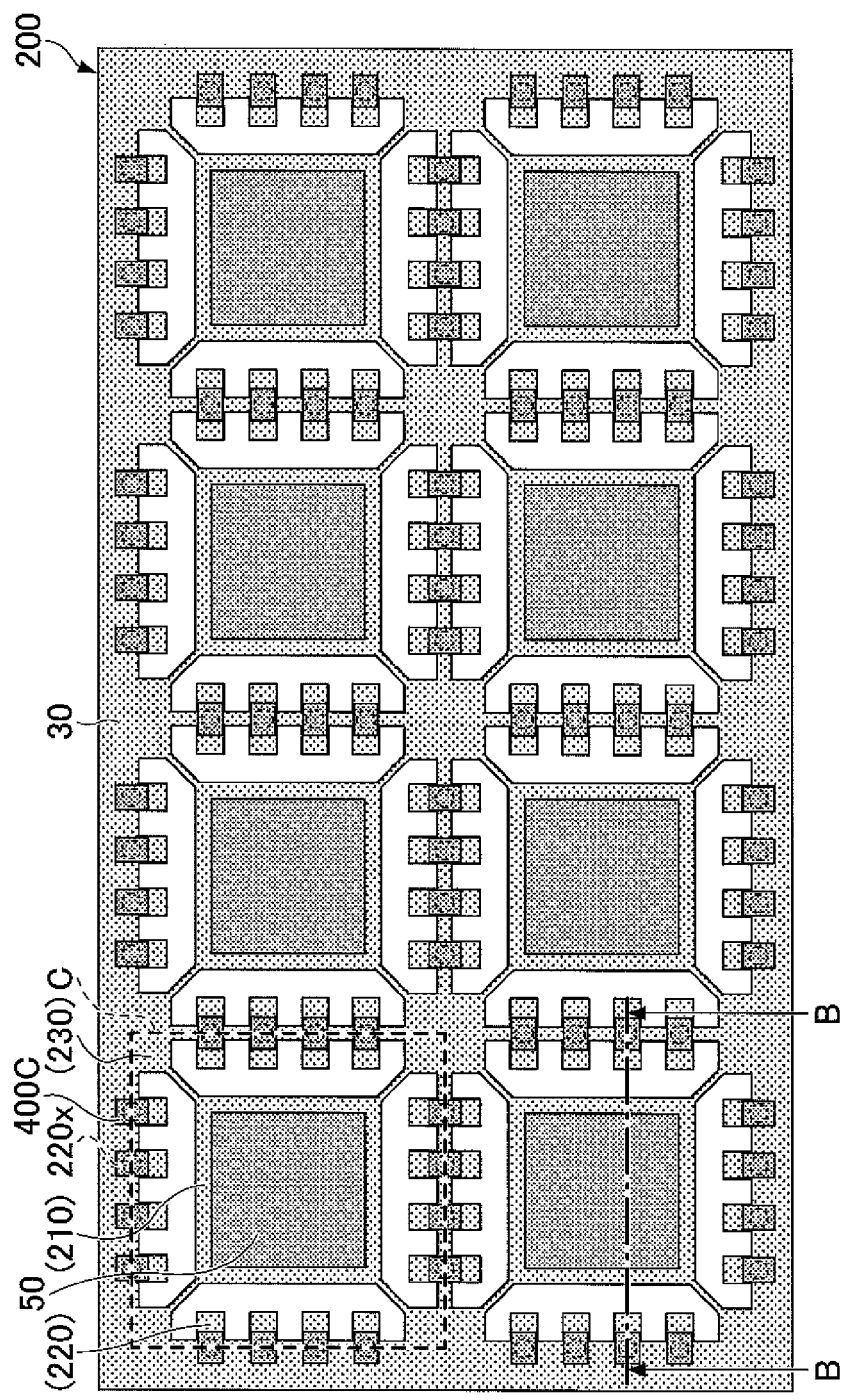
FIGS. 13A and 13B are exemplary views illustrating a manufacturing process of a semiconductor package of the fourth embodiment.
Figure 13B:
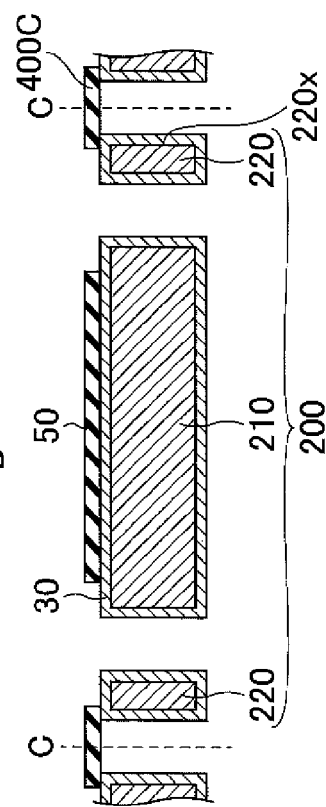

Next, the manufacturing method of the semiconductor package of a fourth embodiment is described. FIGS. 13A and 13B are exemplary views illustrating a manufacturing process of the semiconductor package of the fourth embodiment.

In order to manufacture the semiconductor package 10C, a process illustrated in FIG. 13A is performed instead of the process of the first embodiment illustrated in FIG. 4A. Said differently, a resin film having a bonding layer is adhered to the entire upper surface of the lead frame 200. Thereafter, a useless part is removed to form the lid portions 400C and the joining portion 50 on the individual package C. Said differently, the lid portions 400C and the joining portion 50 are formed by the same resin film (for example, a die attach film). A resin film having the bonding layer is processed to have a predetermined shape, which corresponds to the lid portions 400C and the joining portion 50. The processed resin films are attached to the upper surface sides of the through holes 220x and the upper surface side of the area 210 to thereby form the lid portions 400C and the joining portion 50. The lid portions 400C are members finally to be the lid portions 40C.

As such, the same material may be used for the lid portions 40C and the joining portion 50, and the lid portions 40C and the joining portion 50 may be manufactured by the same process. In a manner similar to the first embodiment, the structure illustrated in FIG. 13A may be shipped as a single product.

MODIFIED EXAMPLE 1

Modified example 1 describes exemplary variations of arrangements of the cutting lines. Within the modified example 1, explanation of constructional elements the same as those described in the above description of the above embodiments is omitted. Although the modified example 1 is described based on the first embodiment, the modified example 1 is applicable to the other embodiments.

Figure 14A:
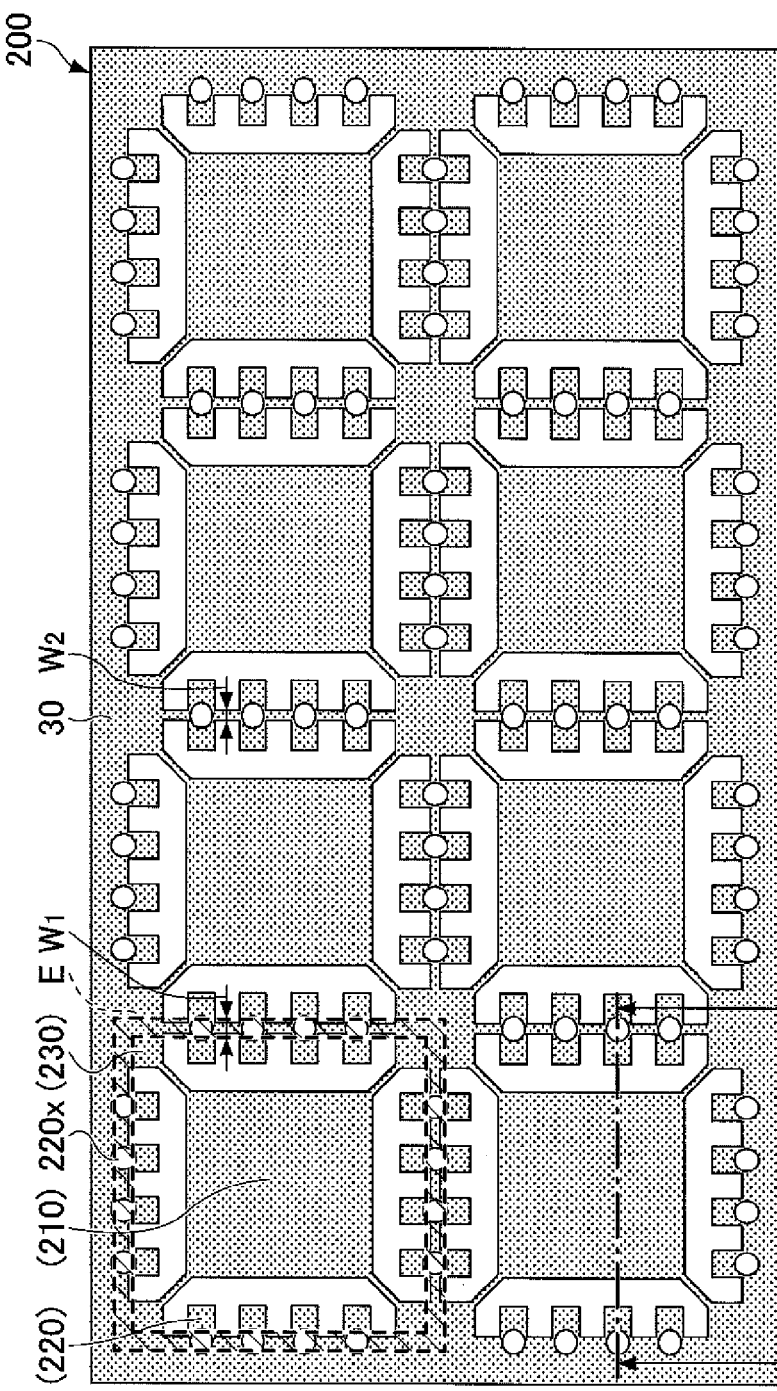
FIGS. 14A and 14B are exemplary views of variations related to setup of cutting lines.
Figure 14B:
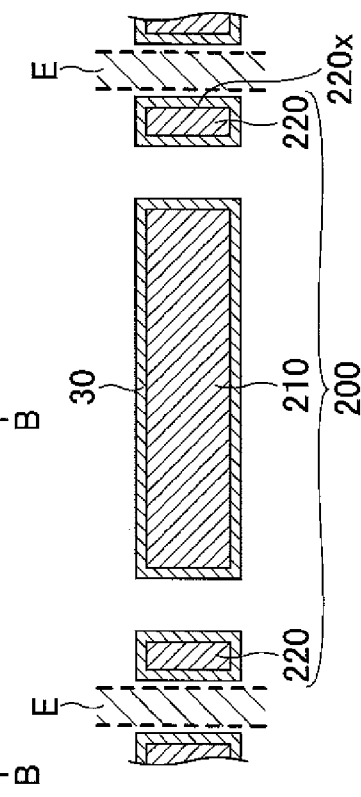

Within the first embodiment, the lead frame 200 is cut out to be diced along the cutting lines indicated by the broken lines. As illustrated in FIG. 14A, within the modified example 1, a portion indicated by C (the cutting line) in FIG. 3A or the like is set wider than that of the first embodiment (the cutting line E of FIG. 14B). Specifically, the width W1 of the cutting line E is set to be greater than the width W2 of bridge portions connecting the areas to be the terminal portions 22. In order to cause the through grooves 22x to be securely formed, it is preferable to set the cutting line E at a position passing through the centers of the through holes 220x.

The manufacturing processes of the semiconductor package related to the modified example 1 is similar to the manufacturing process of the semiconductor package related to the first embodiments as illustrated in FIGS. 3A to 5B. However, after the process illustrated in FIG. 5B, the lead frame 200 is cut out to be diced along the cutting line E illustrated in FIG. 14B. Specifically, a dicing saw having the thickness greater than the width W1 of the cutting line E (blade is thicker) is used to cut the cutting line E to thereby dice the lead frame 200. With this, the lead frame 200 is diced and simultaneously the bridge portions connecting the areas to the terminal portions 22 are removed. Thus, the terminal portions 22 become independent. Then, the manufacturing process of the semiconductor package becomes efficient.

Figure 15A:
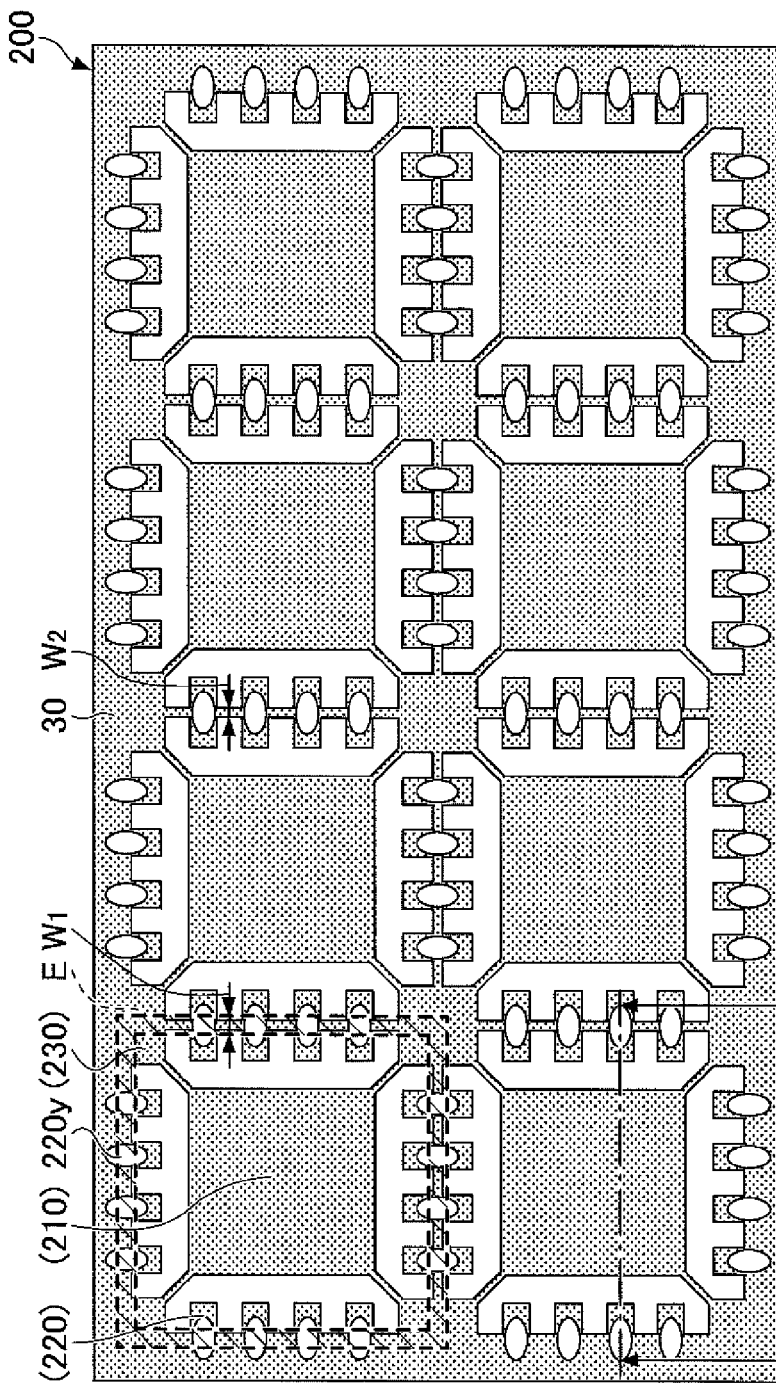
FIGS. 15A and 15B are exemplary views of variations related to setup of the cutting lines.
Figure 15B:
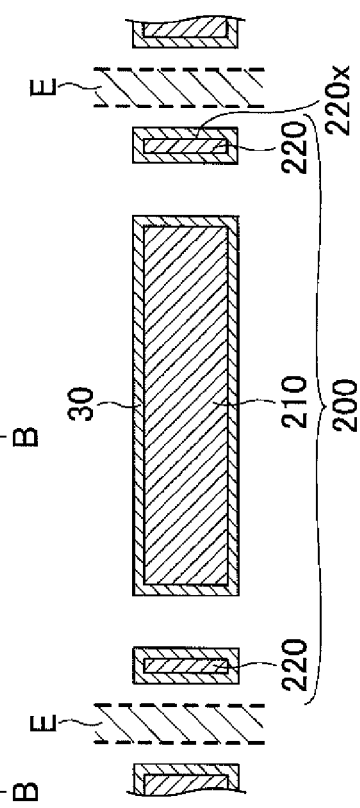

If the diameter of the through hole 220x is smaller than the blade thickness of the dicing saw, the through groove 22x is not formed after dicing. Therefore, the diameter of the through hole 220x is designed to be greater than the blade thickness of the dicing saw. Further, if the shape of the through hole 220x in its plan view is not circle but an ellipse having a major axis crossing the cutting line E like the through holes 220y illustrated in FIG. 15A, it is preferable because the through groove 22x is securely formed. Further, the shape of the through hole 220y in its plan view may be an elongated shape other than the ellipse (for example, a rectangle having the long side crossing the cutting line E).

Figure 16A:
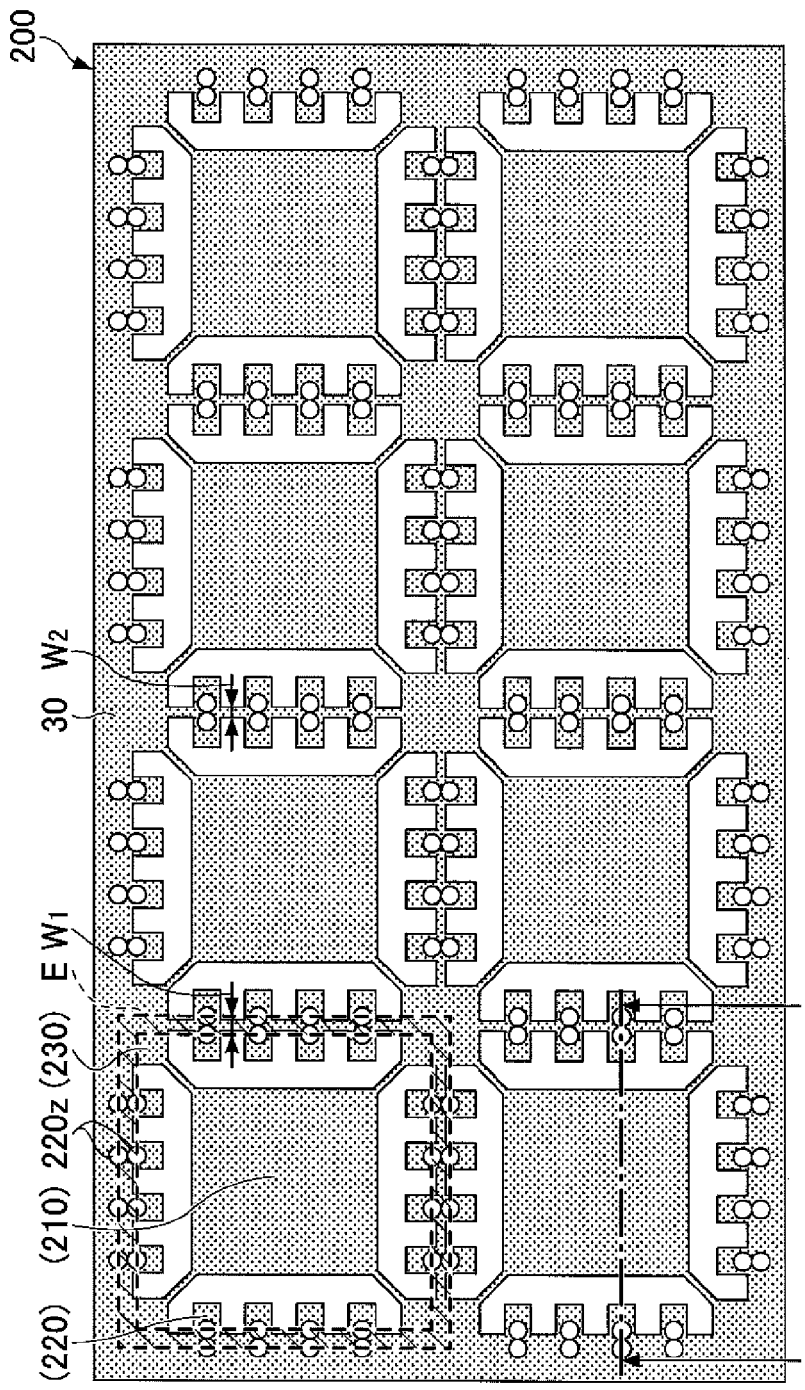
FIGS. 16A and 16B are exemplary views of variations related to setup of the cutting lines.
Figure 16B:
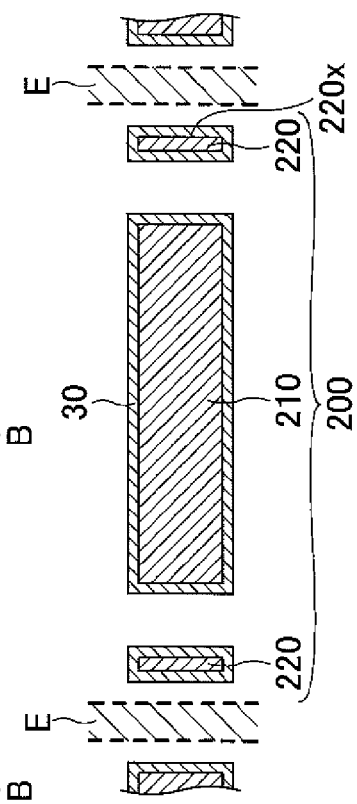

Referring to FIG. 16A, even though two through holes 220z are provided inside the areas to be the terminal portions 22, it is preferable because the through grooves 22x can be securely formed. If the through grooves 22x are securely formed, the shape of the through hole 220z in its plan view may be a circle, an ellipse, or another shape. In the areas to be the terminal portions 22, the through holes 220z may contact each other in their plan views, may be provided so as to mutually overlap, or may be provided so as to be mutually separated. Three or more through holes 220z may be provided in each area of the terminal portions 22.

MODIFIED EXAMPLE 2

Modified example 2 describes other exemplary variations of arrangements of the cutting lines. Within the modified example 2, explanation of constructional elements the same as those described in the above description of the above embodiments is omitted. Although the modified example 2 is described based on the first embodiment, the modified example 2 is applicable to the other embodiments.

Figure 17A:
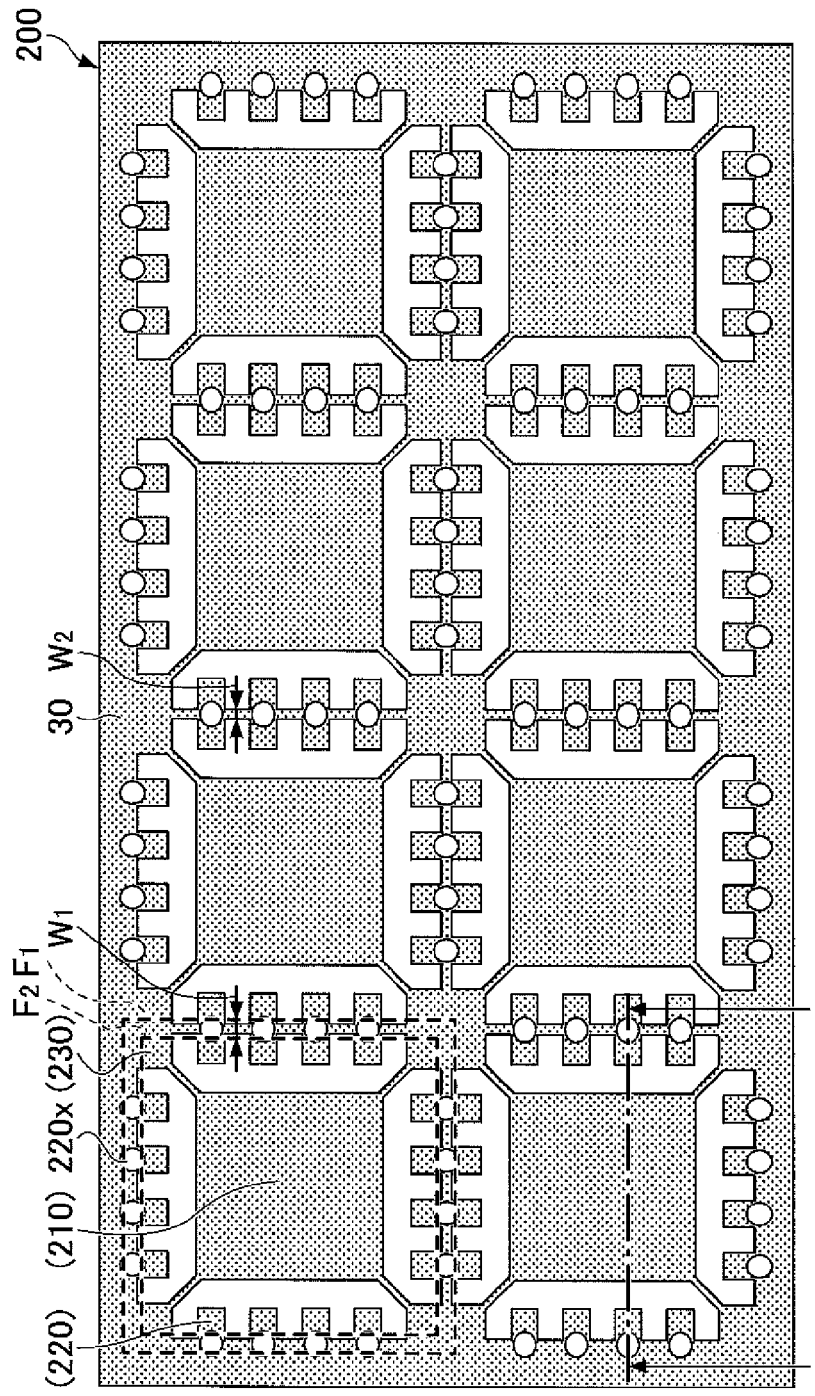
FIGS. 17A and 17B are exemplary views of other variations related to setup of the cutting lines.

Within the first embodiment, the lead frame 200 is cut out to be diced along the cutting lines indicated by the broken lines. As illustrated in FIG. 17A, in the modified example 2, the portion indicated by C in FIG. 3A or the like is replaced by cutting lines F1 and F2. The cutting line F1 is positioned on an outer side of the bridge portion connecting the areas to the terminal portions 22. The cutting line F2 is positioned on an inner side of the bridge portion connecting the areas to the terminal portions 22. The areas surrounded by the cutting line F2 becomes the individual package area.

Figure 17B:
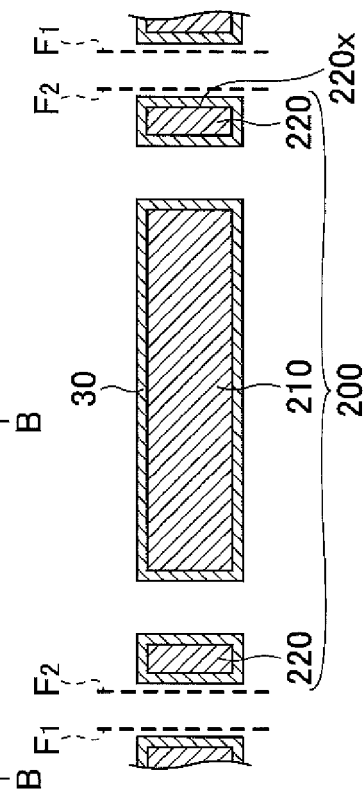

The manufacturing processes of the semiconductor package related to the modified example 2 are similar to the manufacturing processes of the semiconductor package related to the first embodiments as illustrated in FIGS. 3A to 5B. However, when the lead frame 200 is obtained after the process illustrated in FIG. 5B, the dicing saw is used to cut the cutting lines F1 and F2 illustrated in FIG. 17B to dice it into the lead frames 200. With this, the lead frame 200 is diced and simultaneously the bridge portions connecting the areas to the terminal portions 22 are removed. Thus, the terminal portions 22 become independent. Then, the manufacturing process of the semiconductor package becomes efficient.

If the diameter of the through hole 220x is smaller than the distance (a gap) between the cutting lines F1 and F2, the through grooves 22x are not formed after dicing. Then, the diameters of the through holes 220x are designed to be greater than the distance (the gap) between the cutting lines F1 and F2. It is preferable to form the through holes illustrated in FIGS. 15A to 16B in a manner similar to the modified example 1.

On the outer periphery of the lead frame 200, when the two cutting lines F1 and F2 are not provided, a single cutting line may be provided. For example, in the outer periphery of the lead frame 200, the single cutting line positioned at the cutting line F2 illustrated in FIG. 17B may be provided. In this case, the through holes 220x on the outer periphery of the lead frame 200 may be formed so that the single cutting line positioned at, for example, the cutting line F2 illustrated in FIG. 17B passes through the centers of the through holes 220.

The dicing saw used for cutting along the cutting lines F1 and F2 may have a thin blade in a manner similar to the first embodiment instead of a thick blade as in the modified example 1.

MODIFIED EXAMPLE 3

Within the modified example 3, an example of variation of the shape of the resin portion 80 is illustrated. Within the modified example 3, explanation of constructional elements the same as those described in the above description of the above embodiments is omitted. Although the modified example 3 is described based on the first embodiment, the modified example 3 is applicable to the other embodiments.

Figure 18:
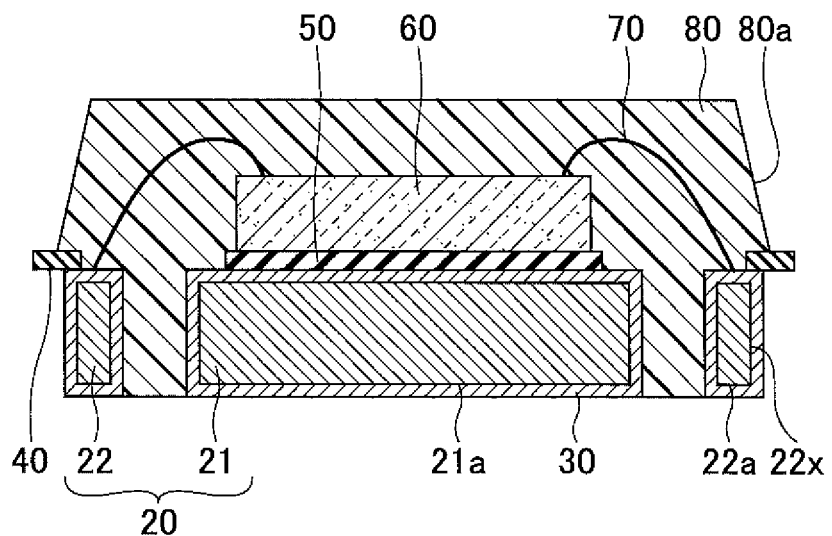
FIG. 18 is an exemplary cross-sectional view of a semiconductor package of a modified example 3.
Figure 19:
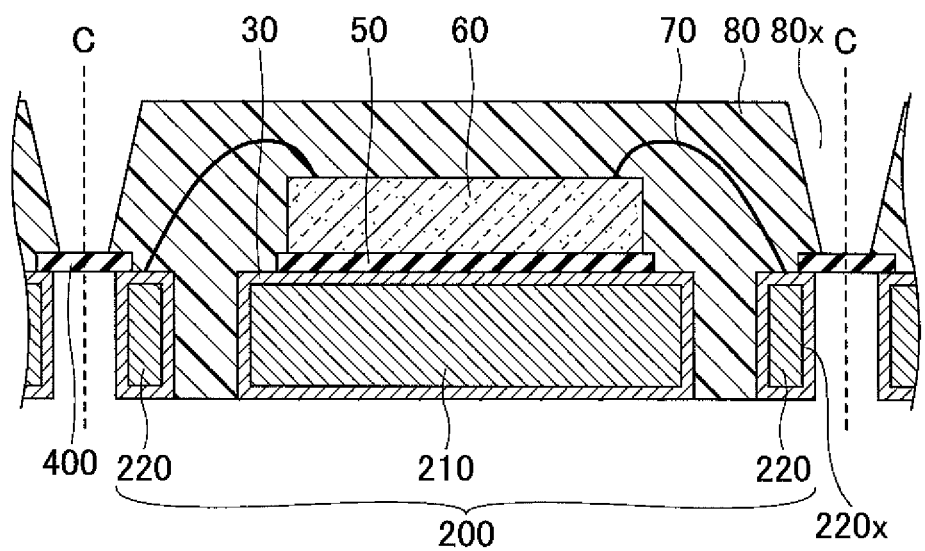
FIG. 19 is an exemplary view of a manufacturing process of the semiconductor package of the modified example 3.

Within the first embodiment, the lead frame 200 is cut out to be diced along the cutting lines indicated by the broken lines. The resin portion 80 is formed on the cutting line indicated by C in FIG. 5B. Said differently, when the lead frame 200 is diced, it is necessary to cut the resin portion 80 on the cutting line. Within the modified example 3, the resin portion 80 is not formed on the cutting line indicated by C. Referring to FIGS. 18 and 19, description is given as follows.

FIG. 18 is an exemplary cross-sectional view of a semiconductor package of the modified example 3. Referring to FIG. 18, in the semiconductor package 10D, a side surface 80a of the resin portion 80 is a sloping surface. The lead frames 20 in the vicinity of the cutting line indicated by C in FIG. 19 and the lid portions are exposed from the resin portion 80. However, the side surfaces 80a of the resin portions 80 are not limited to be the sloping surface. For example, the side surfaces 80a of the resin portions 80 may be substantially perpendicular to the upper surface of the lid portion 40.

FIG. 19 is an exemplary view of a manufacturing process of the semiconductor package of the modified example 3. In order to manufacture the semiconductor package 10D, a process similar to the first embodiment illustrated in FIGS. 3A to 5A is conducted. Next, in the process illustrated in FIG. 19, a resin portion 80 is formed on the lead frame 200 so as to cover the lid portions 400, the joining portion 50, the semiconductor chip 60, and the metallic wires 70. However, groove portions 80x are formed on the resin portion 80 so as to expose cutting lines indicated by C on the resin portion 80. The groove portions 80x are formed by providing protrusions corresponding to the groove portions 80x in a mold used for, for example, a transfer molding method or a compression molding method.

When the lead frames 200 are diced after the process illustrated in FIG. 19, because the cutting lines indicated by C are exposed inside the groove portions 80x. Therefore, the resin portion 80 is not cut. The resin portion 80 is, for example, a so-called mold resin. For example, the mold resin is an epoxy resin containing filler. When the content rate of the filler is high, the dicing saw may be broken by the filler. Within the modified example 3, because the resin portion 80 is not cut, it is possible to prevent the dicing saw from being broken by the filler.

Alternatively, instead of causing the cutting line to be exposed on the resin portion, the thickness of a part of the resin portion coating the cutting line indicated by C can be made less than the thickness of the other parts of the resin portion 80. In this case, the dicing saw cuts the resin portion 80. Since the part of the resin portion 80 to be cut is designed to be previously made thin, it is possible to reduce a probability that the dicing saw is broken by the filler.

Further, within the modified example 3, the cutting line indicated by C is exposed inside the groove portion 80x. Therefore, the cutting line indicated by C may be cut by a punching method of press processing in the process illustrated in FIG. 19. In a case where the thickness of the part of the resin portion 80 coating the cutting line is made less than the other parts of the resin portion 80, it is possible to cut along the cutting line indicated by C by the punching method using the press processing in a manner similar to the above.

Further, the modified example 3 may be combined with the modified examples 1 and 2.

For example, the semiconductor chip 60 may be mounted by a flip chip process on the lead frame 200.

According to the disclosure, a lead frame with which a connection reliability in mounting it on a substrate can be improved, a semiconductor package, and a manufacturing method of the same can be provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A semiconductor package comprising:
  a lead frame including a chip mounting portion and a terminal portion, said lead frame having one side and another side opposite to the one side;
  a semiconductor chip, which is mounted on the chip mounting portion on the one side and connected to the terminal portion;
  a through groove provided on a side surface of the terminal portion so as to penetrate the terminal portion from the one side to the another side in a thickness direction of the terminal portion;
  a lid portion covering an end portion of the through groove on the one side; and
  a resin portion sealing the semiconductor chip and a gap between the chip mounting portion and the terminal portion, wherein an end surface of the terminal portion is coated by a plating film at the another side, wherein the terminal portion has a side surface that is exposed on the resin portion, said side surface having an inner side surface of the through groove that is coated by the plating film, and another part that is not coated by the plating film, wherein surfaces of the chip mounting portion and the terminal portion facing the another side, a side surface of the lid portion facing an outside of the semiconductor package, and a part of the lid portion exposed to the inner side surface of the through groove are exposed on the resin portion, and wherein the through groove is formed only in the terminal portion.

2. The semiconductor package according to claim 1, wherein a number of the terminal portion is plural, a number of the through groove is plural, and a number of the lid portion is plural, wherein each of the through grooves penetrates a corresponding terminal portion, and each of the lid portions covers the end portion of the corresponding through groove.

3. The semiconductor package according to claim 1, wherein a number of the terminal portion is plural, a number of the through groove is plural, and a number of the lid portion is plural, wherein each of the through grooves penetrates a corresponding terminal portion, and each of the lid portions covers the end portion of the adjacent through grooves equal to at least two.

4. The semiconductor package according to claim 1, wherein the inner side surface of the through groove is a curved face substantially in a semicircular shape in a cross-sectional view of the through groove.

5. The semiconductor package according to claim 4, wherein a diameter of the semicircular shape in the cross-sectional view of the through groove is smaller than a width of the terminal portion.

6. A lead frame having one side and another side opposite to the one side, comprising:

a plurality of areas to be diced;

each of the areas includes a chip mounting portion on which a semiconductor chip is to be mounted on the one side, a terminal portion to be an external connection terminal, a supporting portion supporting the chip mounting portion and the terminal portion, a through hole penetrating the terminal portion from the one side to the another side in a thickness direction of the terminal portion, an inner side surface of the through hole being coated by a plating film, and a lid portion covering an end portion of the through hole on the one side, wherein the chip mounting portion and the terminal portion are connected through the supporting portion, and the chip mounting portion, the terminal portion, and the supporting portion are integrally formed of a same material, wherein the through hole is formed to include a cutting line through which the areas are diced, the through hole being defined by a through groove formed in the terminal portion, wherein the through groove is formed only inside the terminal portion.

7. The lead frame according to claim 6, wherein a number of the terminal portion is plural, a number of the through hole is plural, and a number of the lid portion is plural, wherein each of the through holes penetrates a corresponding terminal portion, and each of the lid portions covers the end portion of the corresponding through hole.

8. The lead frame according to claim 6, wherein a number of the terminal portion is plural, a number of the through hole is plural, and a number of the lid portion is plural, wherein each of the through holes penetrates a corresponding terminal portion, and each of the lid portions covers the end portion of the adjacent through holes equal to at least two.

9. The lead frame according to claim 6, wherein the inner side surface of the through groove is a curved face substantially in a semicircular shape in a cross-sectional view of the through groove.

10. The lead frame according to claim 9, wherein a diameter of the semicircular shape in the cross-sectional view of the through groove is smaller than a width of the terminal portion.

* * * * *